(12) United States Patent
Lee

(10) Patent No.: US 12,075,619 B2
(45) Date of Patent: Aug. 27, 2024

(54) THREE-DIMENSIONAL SEMICONDUCTOR DEVICE WITH CONNECTION PATTERN THAT CONTACTS VERTICAL CHANNEL AND SOURCE CHANNEL

(71) Applicant: SK hynix Inc., Icheon-si (KR)

(72) Inventor: Nam Jae Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 348 days.

(21) Appl. No.: 17/193,383

(22) Filed: Mar. 5, 2021

(65) Prior Publication Data

US 2022/0068963 A1 Mar. 3, 2022

(30) Foreign Application Priority Data

Aug. 31, 2020 (KR) ........................ 10-2020-0110578

(51) Int. Cl.
*H10B 43/27* (2023.01)
*G11C 7/18* (2006.01)
*G11C 8/14* (2006.01)
*H01L 23/528* (2006.01)
*H10B 41/10* (2023.01)
(Continued)

(52) U.S. Cl.
CPC ............... *H10B 43/27* (2023.02); *G11C 7/18* (2013.01); *G11C 8/14* (2013.01); *H01L 23/528* (2013.01); *H10B 41/10* (2023.02); *H10B 41/27* (2023.02); *H10B 41/40* (2023.02); *H10B 43/10* (2023.02); *H10B 43/40* (2023.02)

(58) Field of Classification Search
CPC ........ H10B 43/27; H10B 41/10; H10B 41/27; H10B 41/40; H10B 43/10; H10B 43/40; H10B 43/35; H10B 43/30; G11C 7/18; G11C 8/14; G11C 16/0483; H01L 23/528; H01L 21/76877; H01L 25/0657
USPC ........................................................ 257/314
See application file for complete search history.

(56) References Cited

U.S. PATENT DOCUMENTS 6,310,374 B1 * 10/2001 Satoh ..................... H10B 69/00
257/315
9,450,065 B2 * 9/2016 Hattori .................. H10B 43/35
(Continued)

FOREIGN PATENT DOCUMENTS

KR 1020190010403 A 1/2019

*Primary Examiner* — Jami Valentine Miller
*Assistant Examiner* — Pratiksha Jayant Lohakare
(74) *Attorney, Agent, or Firm* — WILLIAM PARK & ASSOCIATES LTD.

(57) ABSTRACT

A semiconductor memory device, and a manufacturing method of the semiconductor memory device, includes: a bit line overlapping with a peripheral circuit layer; interlayer insulating layers and conductive patterns alternately stacked in a first direction on the bit line; vertical channels connected to the bit line, the vertical channels penetrating the interlayer insulating layers and the conductive patterns, the vertical channels protruding farther in the first direction than the stacked interlayer insulating layers and the conductive patterns; a connection pattern in contact with a portion of each of the vertical channels that protrudes farther in the first direction than the stacked interlayer insulating layers and the conductive patterns, the connection pattern connecting the vertical channels; a source channel in contact with the connection pattern, the source channel extending in the first direction; and a source select line surrounding the source channel.

25 Claims, 29 Drawing Sheets

(51) Int. Cl.
*H10B 41/27* (2023.01)
*H10B 41/40* (2023.01)
*H10B 43/10* (2023.01)
*H10B 43/40* (2023.01)

(56) References Cited

U.S. PATENT DOCUMENTS

| | | | |
|---|---|---|---|
| 10,115,667 B2* | 10/2018 | Yun | H10B 43/40 |
| 10,147,732 B1* | 12/2018 | Hu | H10B 41/35 |
| 10,483,277 B2* | 11/2019 | Nishimura | H10B 43/10 |
| 10,644,026 B2* | 5/2020 | Lee | H10B 43/10 |
| 2003/0095429 A1* | 5/2003 | Hirose | G11C 7/18 |
| | | | 257/E21.656 |
| 2006/0098486 A1* | 5/2006 | Hung | G11C 16/12 |
| | | | 365/185.17 |
| 2008/0079055 A1* | 4/2008 | Park | G11C 16/3427 |
| | | | 257/314 |
| 2013/0176781 A1* | 7/2013 | Hung | G11C 16/04 |
| | | | 365/185.05 |
| 2016/0079267 A1* | 3/2016 | Fukuzumi | H10B 41/27 |
| | | | 438/269 |
| 2018/0070035 A1* | 3/2018 | Van den Heijkant | H04N 25/75 |
| 2018/0323213 A1* | 11/2018 | Arai | H10B 43/50 |
| 2019/0067312 A1* | 2/2019 | Arisumi | H10B 43/10 |
| 2019/0296032 A1* | 9/2019 | Noda | H10B 43/20 |
| 2019/0333922 A1* | 10/2019 | Jung | H10B 43/27 |
| 2020/0058670 A1* | 2/2020 | Oh | H10B 41/35 |
| 2020/0066745 A1 | 2/2020 | Yu et al. | |
| 2020/0235125 A1* | 7/2020 | Arai | H10B 41/50 |
| 2020/0266206 A1* | 8/2020 | Fukuo | H10B 41/27 |
| 2021/0036001 A1* | 2/2021 | Kim | H01L 23/5223 |
| 2021/0098476 A1* | 4/2021 | Hong | H10B 43/40 |
| 2022/0165746 A1* | 5/2022 | Lee | H01L 23/5226 |

* cited by examiner

THREE-DIMENSIONAL SEMICONDUCTOR DEVICE WITH CONNECTION PATTERN THAT CONTACTS VERTICAL CHANNEL AND SOURCE CHANNEL

CROSS-REFERENCE TO RELATED APPLICATION

The present application claims priority under 35 U.S.C. § 119(a) to Korean patent application number 10-2020-0110578 filed on Aug. 31, 2020, in the Korean Intellectual Property Office, the entire disclosure of which is incorporated by reference herein.

BACKGROUND

1. Technical Field

The present disclosure generally relates to a semiconductor memory device and a manufacturing method of the semiconductor memory device, and more particularly, to a three-dimensional semiconductor memory device and a manufacturing method of the three-dimensional semiconductor memory device.

2. Related Art

A semiconductor memory device includes memory cells capable of storing data. A three-dimensional semiconductor memory device includes three-dimensionally arranged memory cells, so that a number of memory cells per unit area of a substrate can be increased.

In order to improve the degree of integration of a three-dimensional semiconductor device, an amount of stacking of memory cells may be increased.

SUMMARY

A semiconductor memory device according to an embodiment of the present disclosure may include: a bit line overlapping with a peripheral circuit layer; interlayer insulating layers and conductive patterns alternately stacked in a first direction on the bit line; vertical channels connected to the bit line, the vertical channels penetrating the interlayer insulating layers and the conductive patterns, the vertical channels protruding farther in the first direction than the stacked interlayer insulating layers and the conductive patterns; a connection pattern in contact with a portion of each of the vertical channels that protrudes farther in the first direction than the stacked interlayer insulating layers and the conductive patterns, the connection pattern connecting the vertical channels; a source channel in contact with the connection pattern, the source channel extending in the first direction; and a source select line surrounding the source channel.

A semiconductor memory device according to an embodiment of the present disclosure may include: a word line including a first region, a second region, and a third region between the first region and the second region; a first vertical channel penetrating the first region of the word line, the first vertical channel extending in a first direction; a first connection pattern overlapping with the first region of the word line to be spaced apart from the word line in the first direction, the first connection pattern being in contact with a sidewall of the first vertical channel; a first source channel in contact with the first connection pattern, the first source channel extending in the first direction; and a first source select line overlapping with the first region of the word line to be spaced apart from the first connection pattern in the first direction, the first source select line surrounding the first source channel.

A method of manufacturing a semiconductor memory device according to an embodiment of the present disclosure may include: forming a source select gate layer on a sacrificial substrate; forming a first source channel penetrating the source select gate layer, the first source channel being in contact with the sacrificial substrate; forming a preliminary connection structure connected to the first source channel; forming a cell stack structure including a first vertical channel and conductive patterns, wherein the first vertical channel is in contact with the preliminary connection structure and extends in a first direction, and wherein the conductive patterns surround the first vertical channel and are stacked to be spaced apart from each other in the first direction; forming a bit line connected to the first vertical channel; forming a first bonding structure on the bit line; forming a peripheral circuit layer including a peripheral circuit and a second bonding structure overlapping with the peripheral circuit; bonding the first bonding structure and the second bonding structure to each other; removing the sacrificial substrate to expose the first source channel; and forming a source slit insulating layer penetrating the source select gate layer and the preliminary connection structure, which overlap with the peripheral circuit layer.

BRIEF DESCRIPTION OF THE DRAWINGS

In the drawings, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Specific structural or functional descriptions disclosed herein are merely illustrative for the purpose of describing embodiments according to the concept of the present disclosure. Embodiments according to the concept of the present disclosure can be implemented in various forms, and they should not be construed as being limited to the specific embodiments set forth herein.

Hereinafter, the terms 'first' and 'second' are used to distinguish one component from another component and are not meant to imply a specific number or order of components. The terms may be used to describe various components, but the components are not limited by the terms.

Embodiments provide a semiconductor memory device and a manufacturing method of the semiconductor memory device, which may improve the stability of a manufacturing process.

Figure 1:
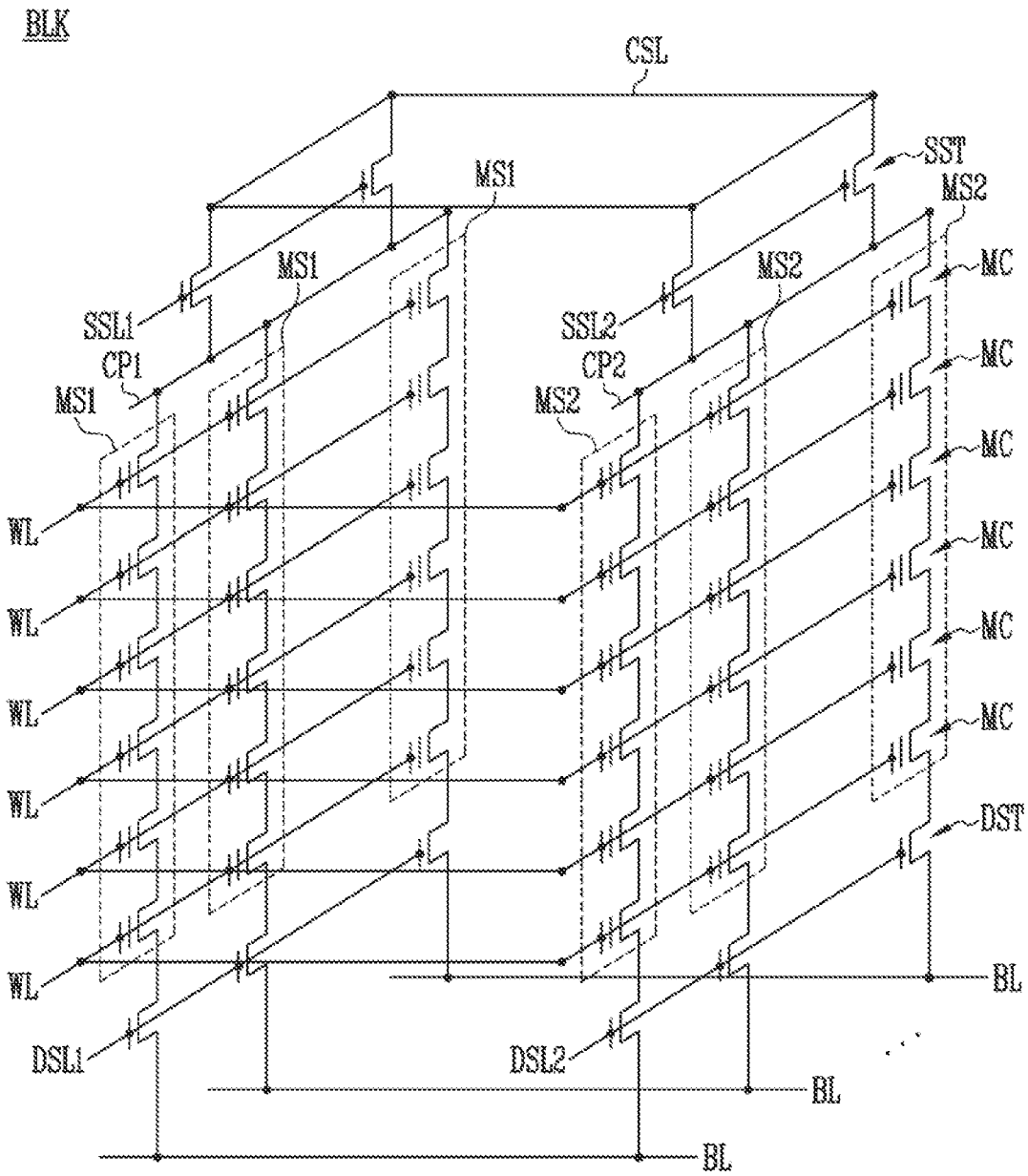
FIG. 1 is a circuit diagram illustrating a memory block of a semiconductor memory device in accordance with an embodiment of the present disclosure.

FIG. 1 is a circuit diagram illustrating a memory block of a semiconductor memory device in accordance with an embodiment of the present disclosure.

The semiconductor memory device may include a plurality of memory blocks BLK. Each memory block BLK may include a plurality of memory cell strings MS1 and MS2.

The memory cell strings MS1 and MS2 may be connected to a common source line CSL via connection patterns CP1 and CP2 and source select transistors SST. The source select transistors SST may be connected in parallel to the common source line CSL. The source select transistors SST may be connected to the memory cell strings MS1 and MS2 via the connection patterns CP1 and CP2. The memory cell strings MS1 and MS2 may be connected to bit lines BL via drain select transistors DST. Each of the memory cell strings MS1 and MS2 may include a plurality of memory cells MC connected in series.

Gates of the source select transistors SST may be connected to source select lines SSL1 and SSL2. Source select transistors SST commonly connected to any one of the source select lines SSL1 and SSL2 may be commonly connected to any one of the connection patterns CP1 and CP2.

Each of the connection patterns CP1 and CP2 may electrically connect a plurality of memory cell strings. Connection between each of the connection patterns CP1 and CP2 and the common source line CSL may be controlled by a signal applied to the source select lines SSL1 and SSL2.

Gates of the drain select transistors DST may be connected to drain select lines DSL1 and DSL2. Memory cell strings MS1 or MS2 may be respectively connected to drain select transistors DST commonly connected to each of the drain select lines DSL1 and DSL2.

Gates of the plurality of memory cells MC may be connected to a plurality of word lines WL. The word lines WL may be disposed at different levels, and gates of memory cells MC disposed at the same level may be connected to the same word line WL.

Memory cell strings MS1 and MS2 selected by each of the word lines WL may be divided into memory cell string groups which can be individually selected by the drain select lines DSL1 and DSL2.

In order to minimize read disturb, a number of memory cell strings selected by each of the source select lines SSL1 and SSL2 may be smaller than a number of memory cell strings selected by each of the word lines WL. In an embodiment, memory cell strings which can be individually selected by the source select lines SSL1 and SSL2 may be the same as those which can be individually selected by the drain select lines DSL1 and DSL2.

Hereinafter, the present disclosure will be mainly described based on an embodiment in which the memory block BLK includes a first source select line SSL1 and a second source select line SSL2, which are isolated from each other, and includes a first drain select line DSL1 and a second drain select line DSL2, which are isolated from each other. However, the present disclosure is not limited thereto, and the memory block BLK may include three or more source select lines isolated from one another and three or more drain select lines isolated from one another.

The memory cell strings MS1 and MS2 may include a first memory cell string group including first memory cell strings and a second memory cell string group including second memory cell strings MS2. The first memory cell strings MS1 may be connected in parallel to a first connection pattern CP1. The second memory cell strings MS2 may be connected in parallel to a second connection pattern.

The first memory cell strings MS1 may be connected to the common source line CSL under the control of source select transistors SST connected to the first source select line SSL1, and be respectively connected to the bit lines BL under the control of drain select transistors DST connected to the first drain select line DSL1. The second memory cell strings MS2 may be connected to the common source line CSL under the control of source select transistors SST connected to the second source select line SSL2, and be respectively connected to the bit lines BL under the control of drain select transistors DST connected to the second drain select line DSL2.

The drain select transistors DST may be respectively connected to the first memory cell strings MS1 and the second memory cell strings MS2. Each of the first connection pattern CP1 and the second connection pattern CP2 may be connected to two or more source select transistors SST. A number of source select transistors SST connected to the first connection pattern CP1 may be smaller than a number of first memory cell strings MS1 connected to the first connection pattern CP1. Similarly, a number of source select transistors SST connected to the second connection pattern CP2 may be smaller than a number of second memory cell strings MS2 connected to the second connection pattern CP2. A pair of first and second memory cell strings MS1 and MS2 may be connected to each of the bit lines BL.

Figure 2:
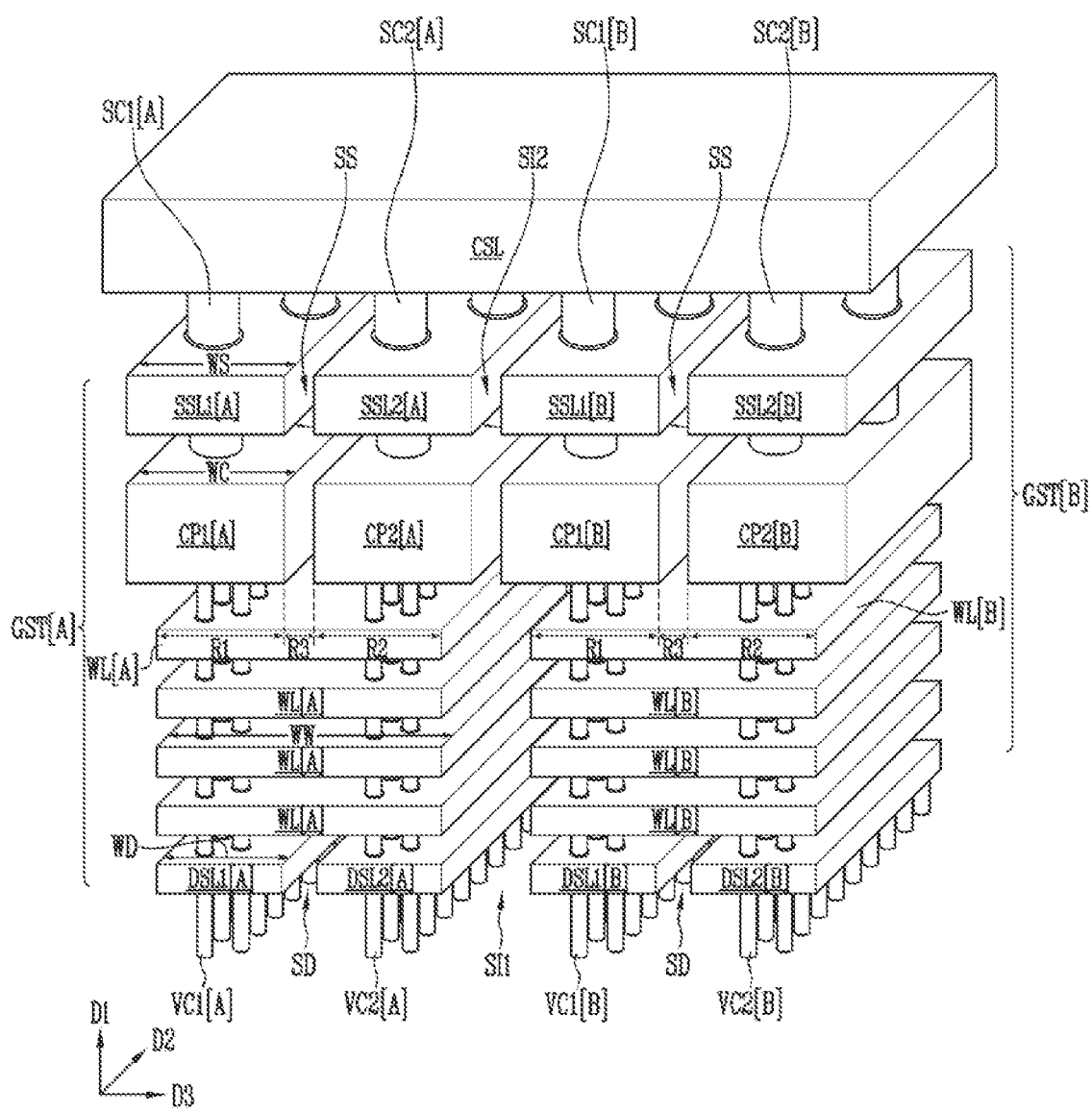
FIG. 2 is a perspective view schematically illustrating a semiconductor memory device in accordance with an embodiment of the present disclosure.

FIG. 2 is a perspective view schematically illustrating a semiconductor memory device in accordance with an embodiment of the present disclosure. In the following drawing, a first direction D1, a second direction D2, and a third direction D3 may respectively correspond to directions in which an X-axis, a Y-axis, and a Z-axis, which are orthogonal to one another, face in an XYZ Cartesian coordinate system. Intersecting directions, as used herein, refers to different directions. In some embodiments, intersecting directions means orthogonal directions.

The semiconductor memory device may include gate stack structures GST[A] and GST[B] isolated from each other. The gate stack structures GST[A] and GST[B] may be isolated from each other by a first slit SI1 and a second slit SI2, which are connected to each other. FIG. 2 illustrates a first gate stack structure GST[A] and a second gate stack structure GST[B] of the semiconductor memory device. Each of the first gate stack structure GST[A] and the second gate stack structure GST[B] may constitute a memory block.

The first gate stack structure GST[A] may include a first drain select line DSL1[A], a second drain select line DSL2[A], a plurality of word lines WL[A], a plurality of first vertical channels VC1[A], a plurality of second vertical channels VC2[A], a first connection pattern CP1[A], a second connection pattern CP2[A], a first source select line SSL1[A], a second source select line SSL2[A], a first source channel SC1[A], and a second source channel SC2[A].

The word lines WL[A] may be stacked in the first direction D1 to be spaced apart from each other. Each of the word lines WL[A] may include a first region R1, a second region R2, and a third region R3 between the first region R1 and the second region R2. Each of the first and second regions R1 and R2 may extend in the second direction D2 and the third direction D3. A width of the third region R3 in the third direction D3 may be defined narrower than a width of each of the first and second regions R1 and R2 in the third direction D3. The third region R3 may extend in the second direction D2.

The first vertical channels VC1[A] may extend in the first direction D1 to penetrate the first region R1 of each of the word lines WL[A]. The second vertical channels VC2[A] may extend in the first direction D1 to penetrate the second region R2 of each of the word lines WL[A]. In other words, each of the word lines WL[A] may extend to surround the first vertical channels VC1[A] and the second vertical channel VC2[A].

The first connection pattern CP1[A] may be spaced apart from the word lines WL[A] in the first direction D1, and overlap with the first region R1 of each of the word lines WL[A]. The first connection pattern CP1[A] may connect the first vertical channels VC1[A].

The second connection pattern CP2[A] may be spaced part from the word lines WL[A] in the first direction D1, and overlap with the second region R2 of each of the word lines WL[A]. The second connection pattern CP2[A] may connect the second vertical channels VC2[A].

The first source select line SSL1[A] may be spaced apart from the first connection pattern CP1[A] in the first direction D1, and overlap with the first region R1 of each of the word lines WL[A]. The first source channel SC1[A] may be in contact with the first connection pattern CP1[A], and extend in the first direction D1 to penetrate the first source select line SSL1[A].

The second source select line SSL2[A] may be spaced apart from the second connection pattern CP2[A] in the first direction D1, and overlap with the second region R2 of each of the word lines WL[A]. The second source channel SC2[A] may be in contact with the second connection pattern CP2[A], and extend in the first direction D1 to penetrate the second source select line SSL2[A].

The first connection pattern CP1[A] may be isolated from the second connection pattern CP2[A] by a source slit SS. The source slit SS may be disposed between the first connection pattern CP1[A] and the second connection pattern CP2[A]. The source slit SS may extend between the first source select line SSL1[A] and the second source select line SSL2[A]. The first source select line SSL1[A] may be isolated from the second source select line SSL2[A] by the source slit SS. The source slit SS may overlap with the third region R3 of each of the word lines WL[A].

The first drain select line DSL1[A] may overlap with the first source select line SSL1[A] with the word lines WL[A] interposed between the first drain select line DSL1[A] and the first source select line SSL1[A]. The first drain select line DSL1[A] may extend to surround the first vertical channels VC1[A].

The second drain select line DSL2[A] may overlap with the second source select line SSL2[A] with the word line WL[A] interposed between the second drain select line DSL2[A] and the second source select line SSL2[A]. The second drain select line DSL2[A] may extend to surround the second vertical channels VC2[A].

The first drain select line DSL1[A] may be isolated from the second drain select line DSL2[A] by a drain slit SD. The drain slit SD may be disposed between the first drain select line DSL1[A] and the second drain select line DSL2[A]. The drain slit SD may overlap with the third region R3 of each of the word lines WL[A], and be disposed between the first vertical channels VC1[A] and the second vertical channels VC2[A].

Similarly to the first gate stack structure GST[A], the second gate stack structure GST[B] may include a first drain select line DSL1[B], a second drain select line DSL2[B], a plurality of word lines WL[B], a plurality of first vertical channels VC1[B], a plurality of second vertical channels VC2[B], a first connection pattern CP1[B], a second connection pattern CP2[B], a first source select line SSL1[B], a second source select line SSL2[B], a first source channel SC1[B], and a second source channel SC2[B].

The word lines WL[A] of the first gate stack structure GST[A]may be isolated from the word lines WL[B] of the second gate stack structure GST[B] by the first slit SI1. The first and second drain select lines DSL1[A] and DSL2[A] of the first gate stack structure GST[A] may be isolated from the first and second drain select lines DSL1[B] and DSL2[B] of the second gate stack structure GST[B] by the first slit SI1. The first and second source select lines SSL1[A] and SSL2[A] of the first gate stack structure GST[A] may be isolated from the first and second source select lines SSL1[B] and SSL2[B] of the second gate stack structure GST[B] by the second slit SI2.

According to the above-described structure, a width WW of each of the word lines WL[A] and WL[B] may be formed wider than a width WD of each of the drain select lines DSL1[A], DSL2[A], DSL1[B], and DSL2[B]; a width WS of each of the source select lines SSL1[A], SSL2[A], SSL1[B], and SSL2[B]; and a width WC of each of the connection patterns CP1[A], CP2[A], CP1[B], and CP2[B].

The first source channel SC1[A] and the second source channel SC2[A] of the first gate stack structure GST[A] and the first source channel SC1[B] and the second source channel SC2[B] of the second gate stack structure GST[B] may be connected to the common source line CSL.

FIGS. 3A to 3D are plan views illustrating source select lines, word lines, drain select lines, and bit lines of a semiconductor memory device in accordance with an embodiment of the present disclosure.

Figure 3A:
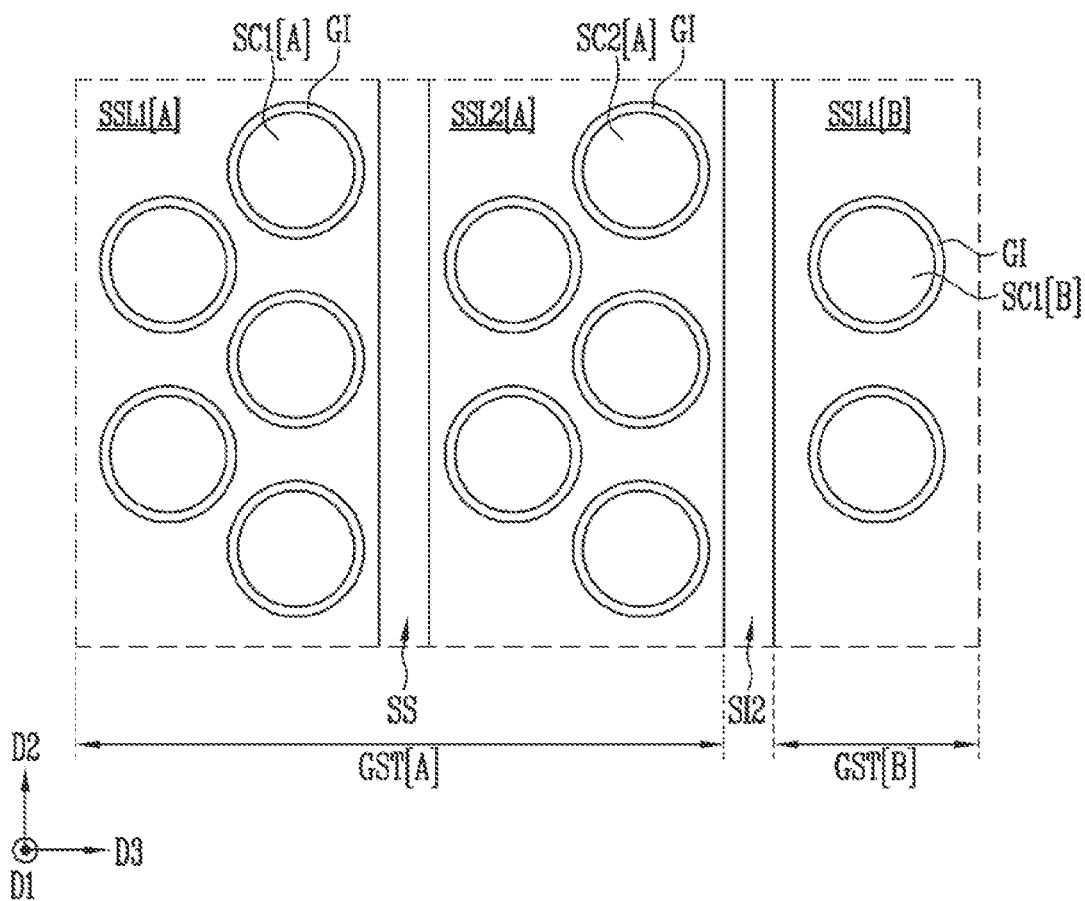
FIGS. 3A to 3D are plan views illustrating source select lines, word lines, drain select lines, and bit lines of a semiconductor memory device in accordance with an embodiment of the present disclosure.

FIG. 3A is a plan view illustrating an embodiment of the first and second source select lines SSL1[A] and SSL2[A] of the first gate stack structure GST[A] shown in FIG. 2 and the first source select line SSL1[B] of the second gate stack structure GST[B] shown in FIG. 2.

Referring to FIG. 3A, the source slit SS may extend in the second direction D2. The second slit SI2 may extend in the second direction D2. The second slit SI2 and the source slit SS may have various shapes, such as a wave shape or a linear shape.

The source select lines SSL1[A], SSL2[A], and SSL1[B] may respectively surround the source channels SC1[A], SC2[A], and SC1[B]. A sidewall of each of the source channels SC1[A], SC2[A], and SC1[B] may be surrounded by a gate insulating layer GI. In other words, each of the source select lines SSL1[A], SSL2[A], and SSL1[B] may surround the source channel SC1[A], SC2[A] or SC1[B] with the gate insulating layer GI interposed therebetween.

Figure 3B:
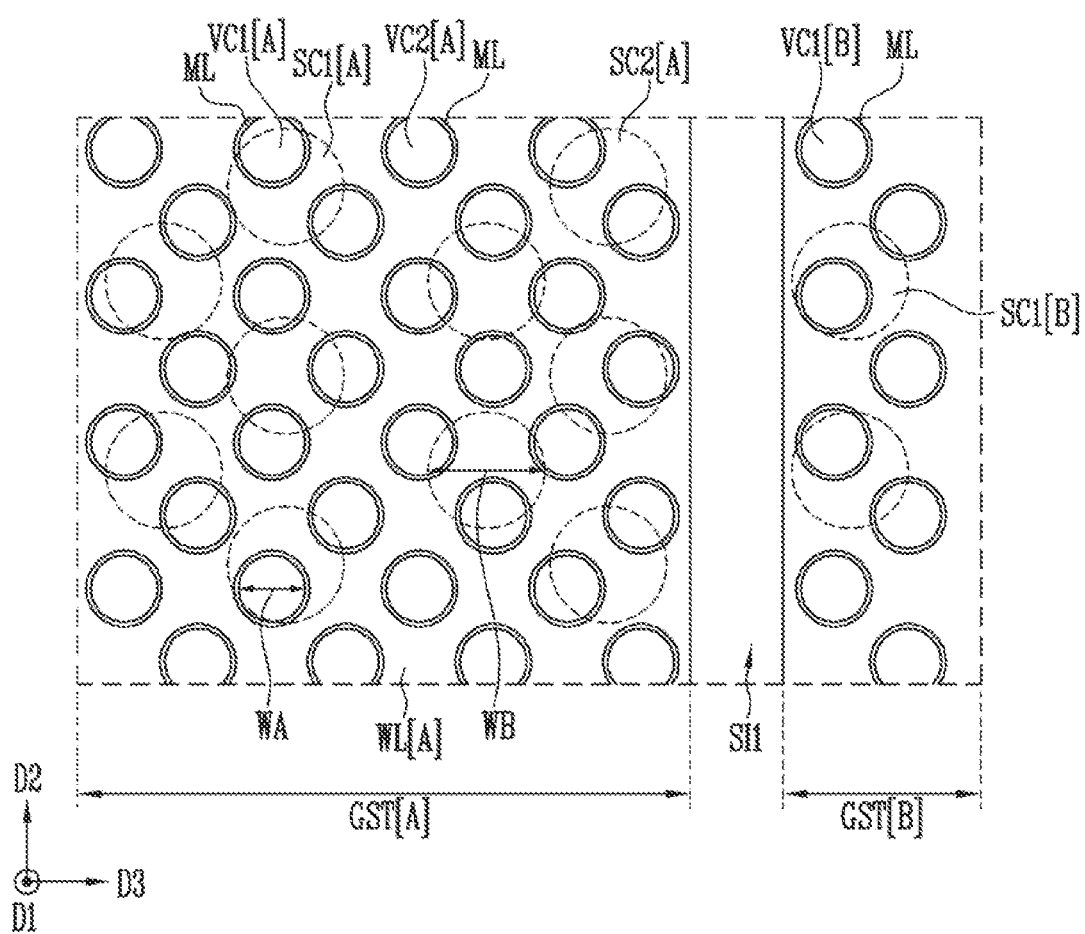

FIG. 3B is a plan view illustrating an embodiment of the word lines WL[A] of the first gate stack structure GST[A] shown in FIG. 2 and the word line WL[B] of the second gate stack structure GST[B] shown in FIG. 2.

Referring to FIG. 3B, the first slit SI1 may extend in the second direction D2. The first slit SI1 may have various shapes, such as a wave shape or a linear shape.

The word lines WL[A] and WL[B] may surround the vertical channels VC1[A], VC2[A], and VC1[B]. A side wall of each of the vertical channels VC1[A], VC2[A], and VC1[B] may be surrounded by a memory layer ML. In other words, each of the word lines WL[A] and WL[B] may surround the vertical channels VC1[A], VC2[A] or VC1[B] with the memory layer ML interposed therebetween.

A width WB of each of the source channels SC1[A], SC2[A], and SC1[B] may be formed wider than a width WA of each of the vertical channels VC1[A], VC2[A], and VC1[B].

The source channels SC1[A], SC2[A], and SC1[B] may be connected to the vertical channels VC1[A], VC2[A], and VC1[B] via the connection patterns CP1[A], CP2[A], and CP1[B] as shown in FIG. 2. Accordingly, in the present disclosure, the degree of arrangement freedom of the source channels SC1[A], SC2[A], and SC1[B] may be improved. Specifically, the source channels SC1[A], SC2[A], and SC1[B] may be connected to the vertical channels VC1[A], VC2[A], and VC1[B] even when the source channels SC1[A], SC2[A], and SC1[B] do not overlap with the vertical channels VC1[A], VC2[A], and VC1[B]. In an embodiment, central regions of some vertical channels among the vertical channels VC1[A], VC2[A], and VC1[B] do not overlap with central regions of the source channels SC1[A], SC2[A], and SC1[B], but may be dislocated from the central regions of the source channels SC1[A], SC2[A], and SC1[B].

In an embodiment, some vertical channels among the vertical channels VC1[A], VC2[A], and VC1[B] might not overlap with the source channels SC1[A], SC2[A], and SC1[B]. In an embodiment, two or more of the vertical channels VC1[A], VC2[A], and VC1[B] may overlap with some source channels among the source channels SC1[A], SC2[A], and SC1[B].

Figure 3C:
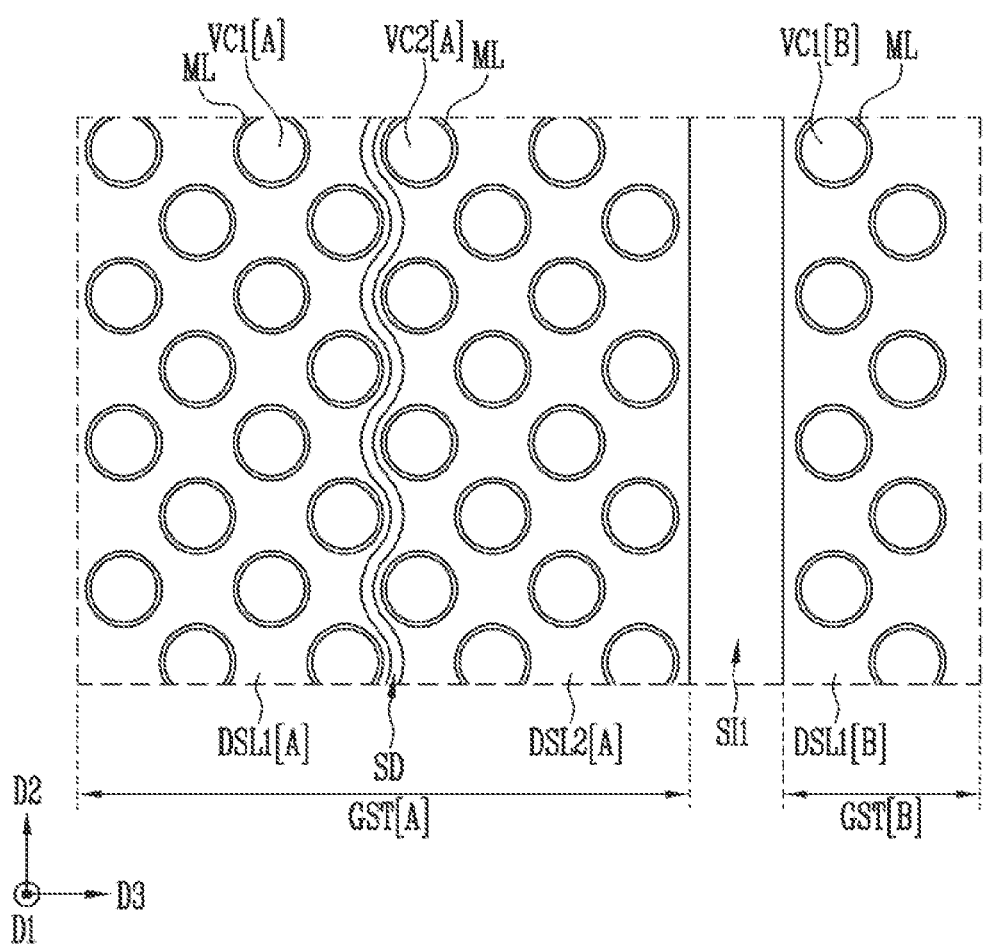

FIG. 3C is a plan view illustrating an embodiment of the first and second drain select lines DSL1[A] and DSL2[A] of the first gate stack structure GST[A] shown in FIG. 2 and the first drain select line DSL1[B] of the second gate stack structure GST[B] shown in FIG. 2.

Referring to FIG. 3C, the drain slit SD may extend in the second direction D2. The drain slit SD may have various shapes, such as a wave shape or a linear shape.

The vertical channels VC1[A], VC2[A], and VC1[B] may extend to penetrate the drain select lines DSL1[A], DSL2[A], and DSL1[B]. The memory layer ML may extend between each of the vertical channels VC1[A], VC2[A], and VC1[B] and each of the drain select lines DSL1[A], DSL2[A], and DSL1[B].

Figure 3D:
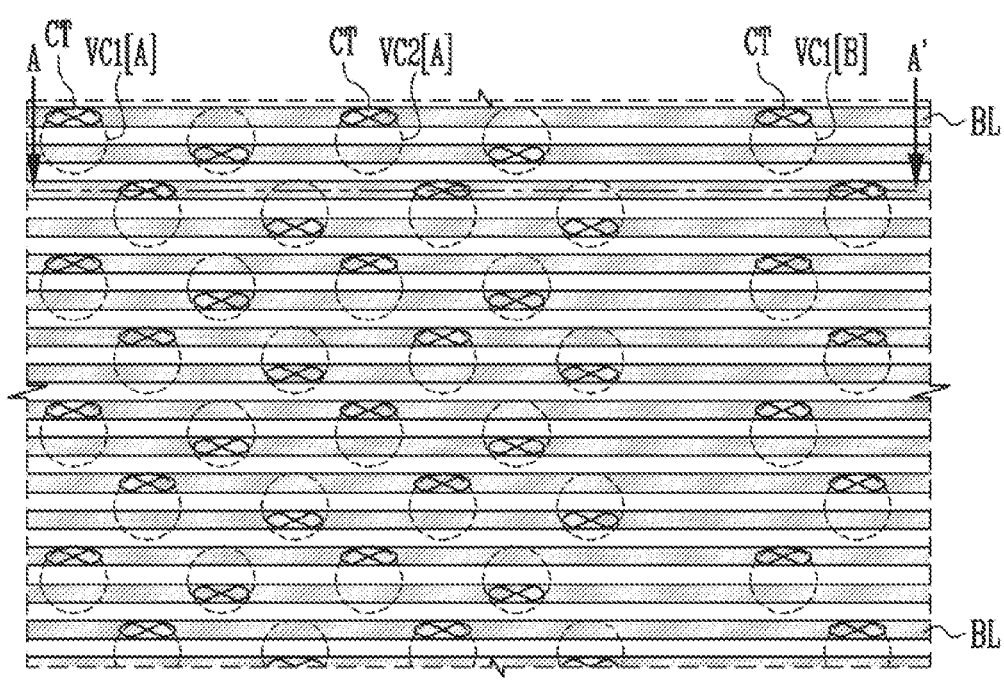
Figure 3D:
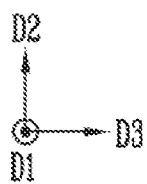

FIG. 3D is a plan view illustrating bit lines in accordance with an embodiment of the present disclosure.

Referring to FIG. 3D, each of the bit lines BL may be connected to the vertical channels VC1[A], VC2[A], and VC1[B] via contact plugs CT. The vertical channels VC1[A], VC2[A], and VC1[B] connected to one bit line BL may be individually controlled by different drain select lines DSL1[A], DSL2[A], and DSL1[B] as shown in FIG. 3C.

Figure 4A:
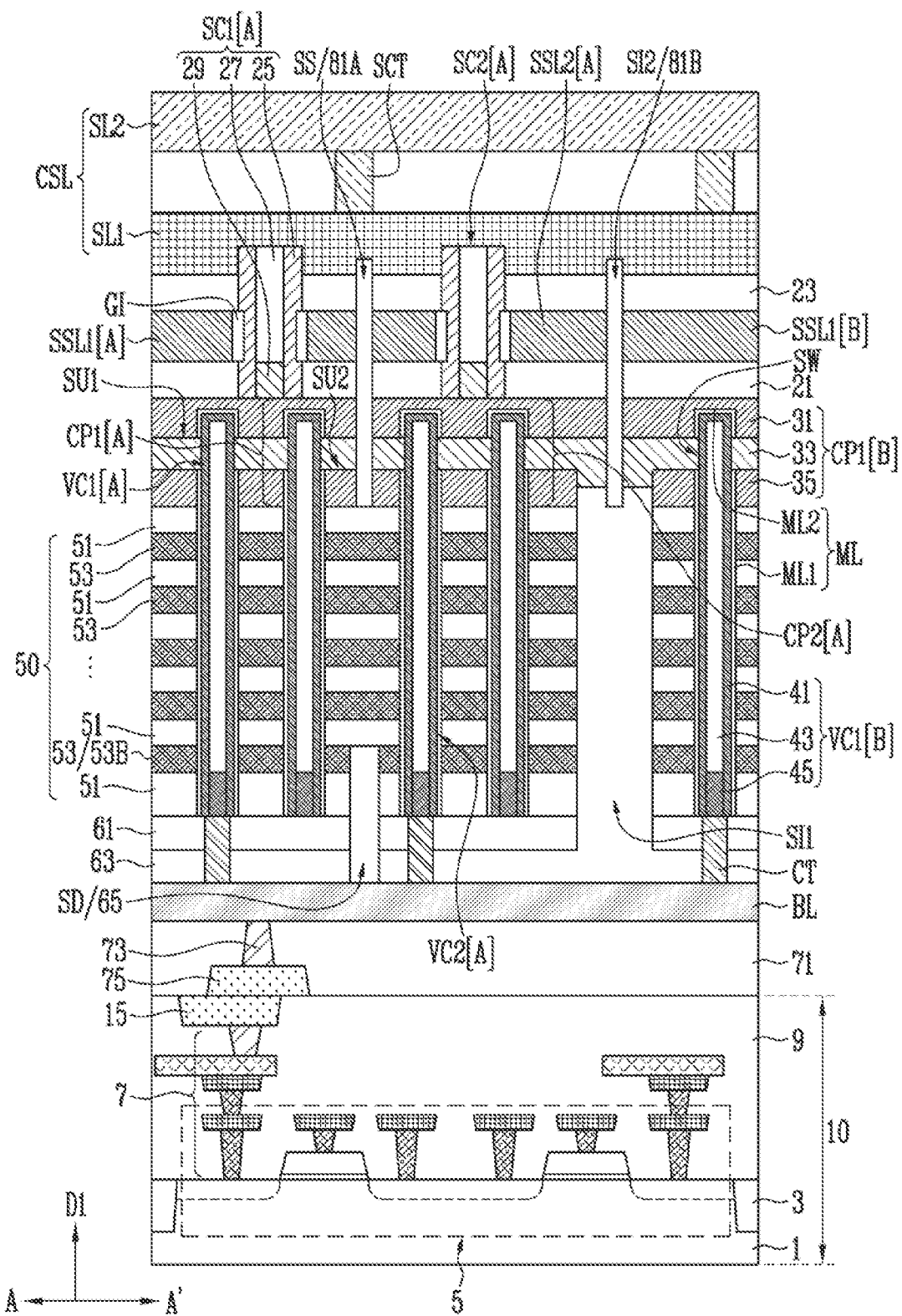
FIGS. 4A and 4B are sectional views of semiconductor memory devices in accordance with embodiments of the present disclosure.
Figure 4B:
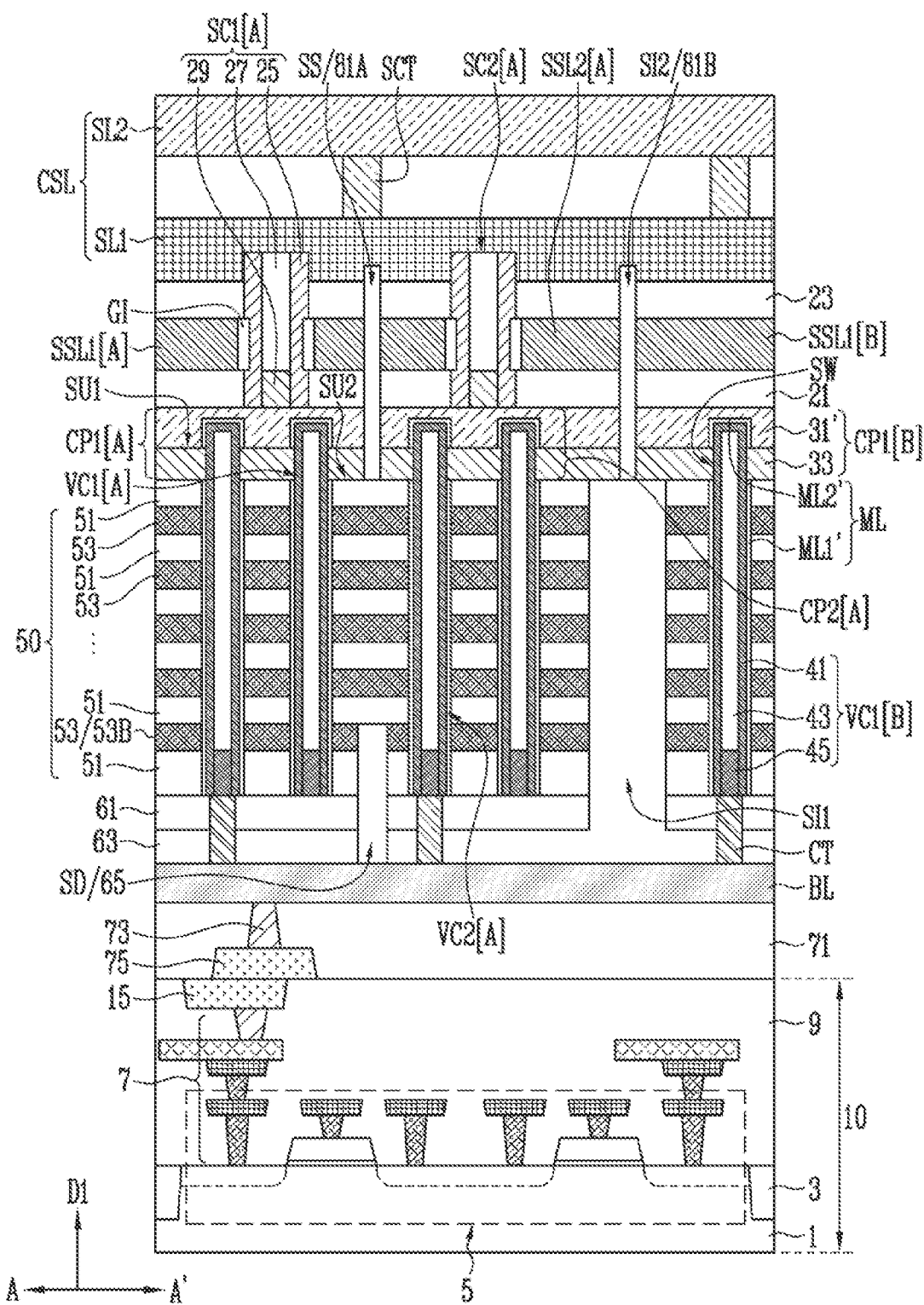

FIGS. 4A and 4B are sectional views of semiconductor memory devices in accordance with embodiments of the present disclosure. Each of FIGS. 4A and 4B illustrates a sectional structure of the semiconductor memory device taken along line A-A' shown in FIG. 3D.

Referring to FIGS. 4A and 4B, each of the semiconductor memory devices may include source select lines SSL1[A], SSL2[A], and SSL1[B] disposed between a bit line BL and a common source line CSL. The source select lines SSL1[A], SSL2[A], and SSL1[B] may be disposed at substantially the same level.

A multi-layered structure 50 may be between the level at which the source select lines SSL1[A], SSL2[A], and SSL1[B] are disposed and the level at which the bit line BL is disposed. The multi-layered structure 50 may include interlayer insulating layers 51 and conductive patterns 53, which are alternately stacked in the first direction D1. The conductive patterns 53 of the multi-layered structure 50 may be used as the word lines WL[A] and WL[B] and the drain select lines DSL1[A], DSL2[A], DSL1[B], and DSL2[B]. In an embodiment, the conductive patterns 53 may include conductive patterns 53B, which are adjacent to the bit line BL and are disposed to be spaced apart from each other in an extending direction of the bit line BL. The conductive patterns 53B among the conductive patterns 53 may be used as drain select lines, and the others may be used as word lines.

Connection patterns CP1[A], CP2[A], and CP1[B] may be disposed between the level at which the source select lines SSL1[A], SSL2[A], and SSL1[B] are disposed and the level at which the multi-layered structure 50 is disposed. The connection patterns CP1[A], CP2[A], and CP1[B] may be disposed at substantially the same level.

The source select lines SSL1[A], SSL2[A], and SSL1[B] may be disposed between a first insulating layer 23 and a second insulating layer 21. The first insulating layer 23 may extend to cover surfaces of the source select lines SSL1[A], SSL2[A], and SSL1[B], which face the common source line CSL.

The source select lines SSL1[A], SSL2[A], and SSL1[B] may be spaced apart from the connection patterns CP1[A], CP2[A], and CP1[B] in the first direction D1 by the second insulating layer 21. The source select lines SSL1[A], SSL2[A], and SSL1[B] may be insulated from the connection patterns CP1[A], CP2[A], and CP1[B] by the second insulating layer 21.

The source select lines SSL1[A], SSL2[A], and SSL1[B] may be penetrated by source channels SC1[A] and SC2[A].

The source channels SC1[A] and SC2[A] may extend to penetrate the second insulating layer 21 and be in contact with the connection patterns CP1[A] and CP2[A]. The source channels SC1[A] and SC2[A] may penetrate the first insulating layer 23, and protrude farther in the first direction D1 than the first insulating layer 23. A gate insulating layer GI may be disposed between the second insulating layer 21 and the first insulating layer 23, and surround a sidewall of each of the source channels SC1[A] and SC2[A].

The source channels SC1[A] and SC2[A] may be connected to the common source line CSL. In an embodiment, the common source line CSL may include a first source layer SL1 and a second source layer SL2, which are stacked in the first direction D1 to be spaced apart from each other. Each of the first source layer SL1 and the second source layer SL2 may extend to overlap with the source select lines SSL1[A], SSL2[A], and SSL1[B]. Each of the first source layer SL1 and the second source layer SL2 may include various conductive materials. The first source layer SL1 may include a conductive material which may provide an ohmic contact. In an embodiment, the first source layer SL1 may include tungsten silicide. The second source layer SL2 may include a conductive material having a resistivity lower than a resistivity of the first source layer SL1. The first source layer SL1 and the second source layer SL2 may be connected to each other by source contact plugs SCT.

Each of the source channels SC1[A] and SC2[A] may include a source core insulating layer 27, a source channel layer 25, and a doped semiconductor pattern 29. The source channel layer 25 may extend along an inner wall of the gate insulating layer GI, and be formed in a tubular shape. The source core insulating layer 27 and the doped semiconductor pattern 29 may fill a central region of each of the source channels SC1[A] and SC2[A], which is defined by the tubular source channel layer 25.

The source core insulating layer 27 may be in contact with the first source layer SL1. The doped semiconductor pattern 29 may be in contact with any one of the connection patterns CP1[A] and CP2[A], which corresponds to the doped semiconductor pattern 29.

The doped semiconductor pattern 29 may be disposed between any one of the connection patterns CP1[A] and CP2[A] and the source core insulating layer 27.

The source channel layer 25 may extend to surround a sidewall of the source core insulating layer 27 and a sidewall of the doped semiconductor pattern 29. The source channel layer 25 may penetrate the first insulating layer 23 and the second insulating layer 21, and be in contact with any one of the connection patterns CP1[A] and CP2[A] and the first source layer SL1. The source channel layer 25 may include a semiconductor layer material. In an embodiment, the source channel layer 25 may include silicon. The source channel layer 25 and the source core insulating layer 27 may extend to the inside of the first source layer SL1.

The source channels SC1[A] and SC2[A] may be connected to vertical channels VC1[A] and VC2[A] via the connection patterns CP1[A] and CP2[A]. Each of the connection patterns CP1[A], CP2[A], and CP1[B] may include a channel contact layer 33. Each of the vertical channels VC1[A], VC2[A], and VC1[B] may include a sidewall SW in contact with the channel contact layer 33.

The channel contact layer 33 may include a first surface SU1 and a second surface SU2, which face in directions opposite to each other. Hereinafter, a surface of the channel contact layer 33, which faces the source select lines SSL1[A], SSL2[A], and SSL1[B], is designated as the first surface SU1, and a surface of the channel contact layer 33, which faces the bit line BL, is designated as the second surface SU2.

Referring to FIG. 4A, in accordance with an embodiment, each of the connection patterns CP1[A], CP2[A], and CP1[B] may further include a first conductive layer 31 and a second conductive layer 35. The first conductive layer 31 may extend along the first surface SU1 of the channel contact layer 33. The second conductive layer 35 may extend along the second surface SU2 of the channel contact layer 33.

Each of the vertical channels VC1[A], VC2[A], and VC1[B] may protrude farther in the first direction D1 than the multi-layered structure 50. In an embodiment, each of the vertical channels VC1[A], VC2[A], and VC1[B] may penetrate the second conductive layer 35 and the channel contact layer 33, and extend to the inside of the first conductive layer 31. Accordingly, each of the vertical channels VC1[A], VC2[A], and VC1[B] may include a portion surrounded by the first conductive layer 31 and a portion surrounded by the second conductive layer 35.

The channel contact layer 33 may penetrate a memory layer ML between the first conductive layer 31 and the second conductive layer 35. Accordingly, the memory layer ML may be isolated into a first memory pattern ML1 and a second memory pattern ML2 by the channel contact layer 33.

The first memory pattern ML1 may extend along sidewalls of the interlayer insulating layers 51 and sidewalls of the conductive patterns 53 between each of the vertical channels VC1[A], VC2[A], and VC1[B] and the multi-layered structure 50. The first memory pattern ML1 may extend between each of the vertical channels VC1[A], VC2[A], and VC1[B] and the second conductive layer 35. The second memory pattern ML2 may be disposed between each of the vertical channels VC1[A], VC2[A], and VC1[B] and the first conductive layer 31.

In the above, each of the first conductive layer 31, the channel contact layer 33, and the second conductive layer 35 may include a doped semiconductor layer. In an embodiment, each of the first conductive layer 31, the channel contact layer 33, and the second conductive layer 35 may include doped silicon.

Referring to FIG. 4B, in accordance with an embodiment, each of the connection patterns CP1[A], CP2[A], and CP1[B] may further include a conductive layer 31' extending along the first surface SU1 of the channel contact layer 33.

Each of the vertical channels VC1[A], VC2[A], and VC1[B] may penetrate the channel contact layer 33, and extend to the inside of the conductive layer 31'. Accordingly, each of the vertical channels VC1[A], VC2[A], and VC1[B] may include a portion surrounded by the conductive layer 31'.

The channel contact layer 33 may penetrate the memory layer ML between the conductive layer 31' and the multi-layered structure 50. Accordingly, the memory layer ML may be isolated into a first memory pattern ML1' and a second memory pattern ML2' by the channel contact layer 33.

The first memory pattern ML1' may surround a portion of each of the vertical channels VC1[A], VC2[A], and VC1[B] penetrating the multi-layered structure 50. The second memory pattern ML2' may be disposed between each of the vertical channels VC1[A], VC2[A], and VC1[B] and the conductive layer 31'.

In the above, the channel contact layer 33 may include a doped semiconductor layer. The conductive layer 31' may include a conductive material which may provide an ohmic contact. In an embodiment, the conductive layer 31' may include tungsten silicide.

Referring back to FIGS. 4A and 4B, each of the vertical channels VC1[A], VC2[A], and VC1[B] may include a core insulating layer 43, a channel layer 41, and a doped semiconductor pattern 45. The core insulating layer 43 may extend in the first direction D1 to penetrate the interlayer insulating layers 51 and the conductive patterns 53. The core insulating layer 43 may overlap with the doped semiconductor pattern 45.

The channel layer 41 may surround a sidewall of the core insulating layer 43. The channel layer 41 may extend between the core insulating layer 43 and the first conductive layer 31 or between the core insulating layer 43 and the conductive layer 31' to close an end of the core insulating layer 43, which faces the first source layer SL1. The channel layer 41 may extend to surround a sidewall of the doped semiconductor pattern 45. The sidewall SW in contact with the channel contact layer 33 may be a partial sidewall of the channel layer 41, and the channel contact layer 33 may be in direct contact with the channel layer 41. The channel layer 41 may include a semiconductor material. In an embodiment, the channel layer 41 may include silicon.

The vertical channels VC1[A], VC2[A], and VC1[B] may be connected to the bit line BL. The bit line BL may be connected to the vertical channels VC1[A], VC2[A], and VC1[B] via contact plugs CT. The contact plugs CT may penetrate insulating layers 61 and 63 disposed between the bit line BL and the multi-layered structure 50, and be in contact with the vertical channels VC1[A], VC2[A], and VC1[B]. The bit line BL may extend to overlap with the source select lines SSL1[A], SSL2[A], and SSL1[B] with the multi-layered structure 50 interposed therebetween.

In an embodiment, a third insulating layer 61 and a fourth insulating layer 63 may be disposed between the bit line BL and the multi-layered structure 50. The fourth insulating layer 63 may fill a first slit SI1, and extend to overlap with the third insulating layer 61.

The third insulating layer 61 and the fourth insulating layer 63 may be penetrated by a drain slit SD. The drain slit SD may be filled with a drain slit insulating layer 65. The drain slit SD and the drain slit insulating layer 65 may extend between the conductive patterns 53B used as drain select lines.

A source slit SS and a second slit SI2 may be respectively filled with first and second source slit insulating layers 81A and 81B. The first and second source slit insulating layers 81A and 81B may extend between the source select lines SSL1[A], SSL2[A], and SSL1[B] and between the connection patterns CP1[A], CP2[A], and CP1[B].

The multi-layered structure 50 may overlap with a peripheral circuit layer 10 with the bit line BL interposed between the multi-layered structure 50 and the peripheral circuit layer 10. The bit line BL may be connected to a first bonding pad 75 via a first interconnection structure 73. The first interconnection structure 73 and the first bonding pad 75 may be buried in a first insulating structure 71. The peripheral circuit layer 10 may overlap with the bit line BL with the first interconnection structure 73 and the first bonding pad 75, which are interposed between the peripheral circuit layer 10 and the bit line BL.

The peripheral circuit layer 10 may include a substrate 1 including active regions partitioned by isolation layers 3, a peripheral circuit 5 for controlling an operation of a memory block, such as a program operation, a read operation, or an erase operation, a second interconnection structure 7 connected to the peripheral circuit 5, and a second bonding pad 15 connected to the second interconnection structure 7. The peripheral circuit 5, the second interconnection structure 7, and the second bonding pad 15 may be buried in a second insulating structure 9 disposed on the substrate 1. The peripheral circuit 5 may include a page buffer circuit for controlling the bit line BL. The second bonding pad 15 may be bonded to the first bonding pad 75. The second insulating structure 9 may be bonded to the first insulating structure 71.

Figure 5A:
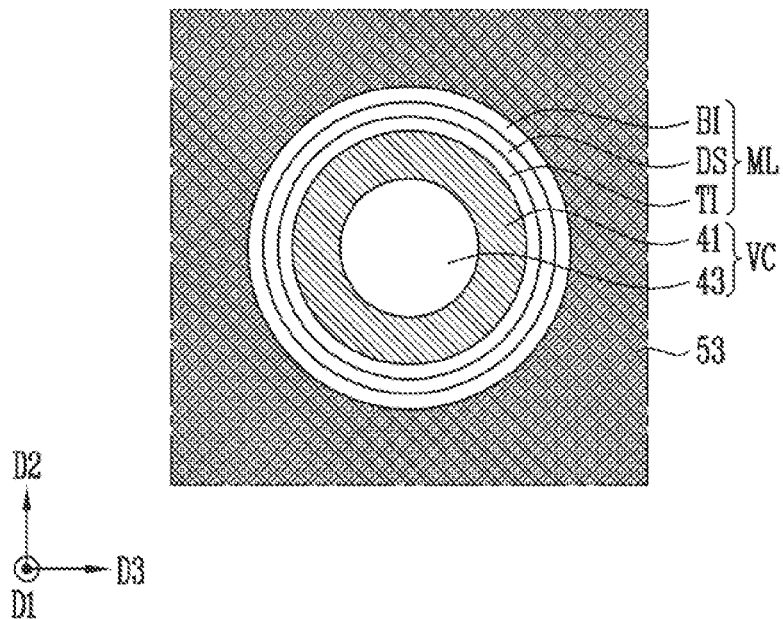
FIGS. 5A to 5C are enlarged cross-sectional views illustrating a vertical channel and a source channel in accordance with an embodiment of the present disclosure.
Figure 5B:
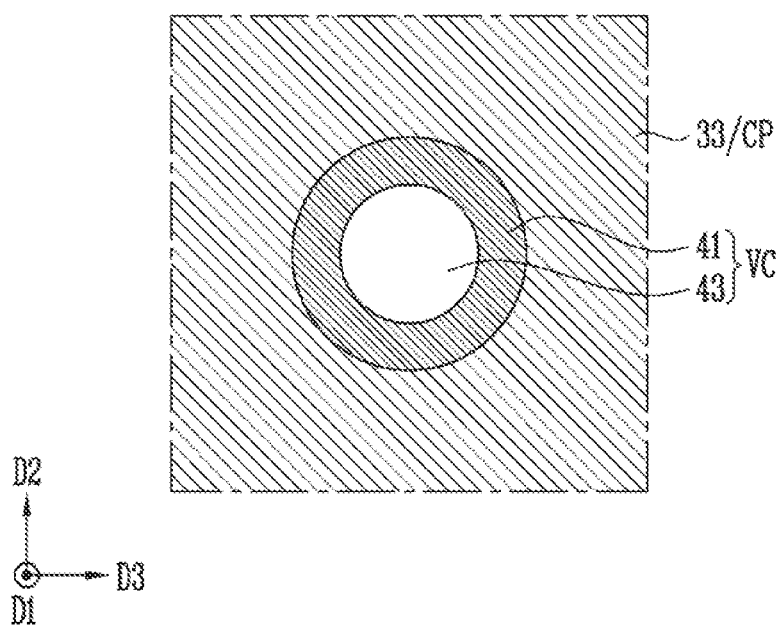
Figure 5C:
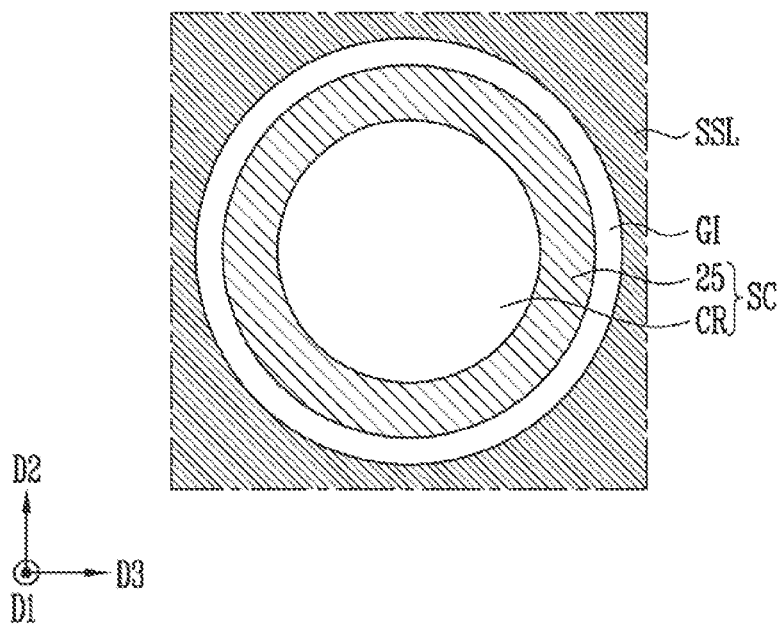

FIGS. 5A to 5C are enlarged cross-sectional views illustrating a vertical channel and a source channel in accordance with an embodiment of the present disclosure.

Referring to FIG. 5A, the vertical channel VC may be surrounded by a conductive pattern 53 with a memory layer ML interposed between the vertical channel VC and the conductive pattern 53. The memory layer ML may include a tunnel insulating layer TI, a data storage layer DS, and a blocking insulating layer BI.

The tunnel insulating layer TI may extend along a surface of a channel layer 41 of the vertical channel VC. The tunnel insulating layer TI may include an insulating material through which charges can tunnel. In an embodiment, the tunnel insulating layer TI may include a silicon oxide layer.

The data storage layer DS may extend along a surface of the tunnel insulating layer TI. The data storage layer DS may include a material layer capable of storing data. In an embodiment, the data storage layer DS may include a nitride layer capable of storing data changed by using Fowler-Nordheim tunneling.

The blocking insulating layer BI may extend along a surface of the data storage layer DS. The blocking insulating layer BI may include an oxide layer.

Referring to FIG. 5B, the vertical channel VC may be surrounded by a channel contact layer 33 of a connection pattern CP. The channel layer 41 of the vertical channel VC may be in contact with the channel contact layer 33.

Referring to FIGS. 5A and 5B, a core insulating layer 43 of the vertical channel VC may fill a central region of the vertical channel VC, and be surrounded by the channel layer 41.

Referring to FIG. 5C, the source channel SC may be surrounded by a source select line SSL with a gate insulating layer GI interposed between the source channel SC and the source select line SSL.

The source channel SC may include a source channel layer 25. A region surrounded by the source channel layer 25 may be defined as a central region CR of the source channel SC. The central region CR of the source channel SC may be filled with the source core insulating layer 27 and the doped semiconductor pattern 29, which are shown in FIGS. 4A and 4B.

The gate insulating layer GI may include oxide of the source select line SSL. In an embodiment, the gate insulating layer GI may include silicon oxide.

FIGS. 6A to 6D are sectional views illustrating a process of forming source channels in accordance with an embodiment of the present disclosure.

Figure 6A:
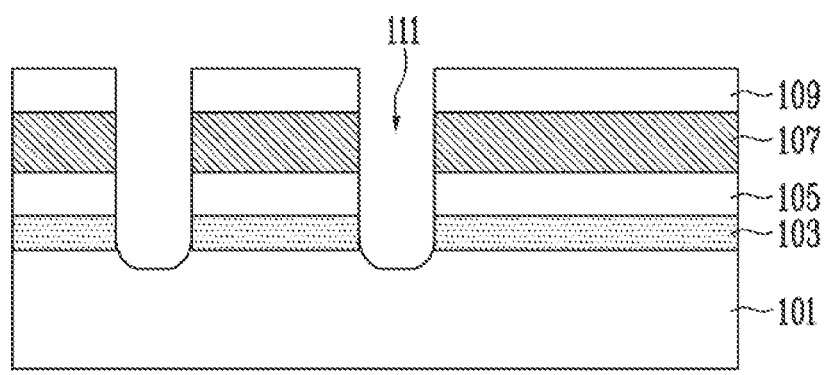
FIGS. 6A to 6D are sectional views illustrating a process of forming source channels in accordance with an embodiment of the present disclosure.

Referring to FIG. 6A, a source select gate layer 107 may be formed on a sacrificial substrate 101. Although not shown in the drawing, the sacrificial substrate 101 may be in contact with an electrostatic chuck (ESC) of a semiconductor manufacturing apparatus. The sacrificial substrate 101 may be a silicon substrate.

Before the source select gate layer 107 is formed, an etch stop layer 103 may be formed on the sacrificial substrate 101. The etch stop layer 103 may include a material having an etch selectivity with respect to the sacrificial substrate 101. In an embodiment, the etch stop layer 103 may include a nitride layer.

Before the source select gate layer 107 is formed, a first insulating layer 105 may be formed on the etch stop layer 103. After the source select gate layer 107 is formed, a second insulating layer 109 may be formed on the source select gate layer 107. The source select gate layer 107 may include various conductive materials. In an embodiment, the source select gate layer 107 may include doped silicon.

Subsequently, first channel holes 111 may be formed, which penetrate the source select gate layer 107 and expose the sacrificial substrate 101. The first channel holes 111 may extend to penetrate the etch stop layer 103, the first insulating layer 105, and the second insulating layer 109.

Figure 6B:
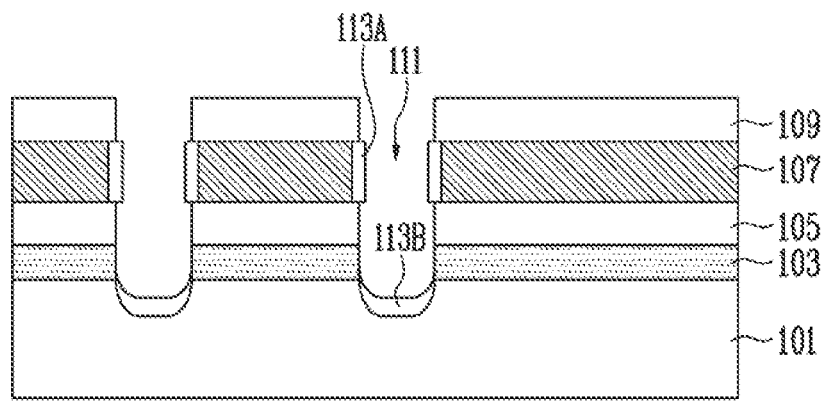

Referring to FIG. 6B, a gate insulating layer 113A may be formed on a sidewall of the source select gate layer 107, which is exposed through the first channel holes 111. In an embodiment, the gate insulating layer 113A may be formed through an oxidation process. When a portion of the sidewall of the source select gate layer 107 including silicon is oxidized, the gate insulating layer 113A may extend to the inside of the first channel hole 111.

A dummy insulating layer 113B may be formed by oxidizing a portion of the sacrificial substrate 101, while the source select gate layer 107 is oxidized.

Figure 6C:
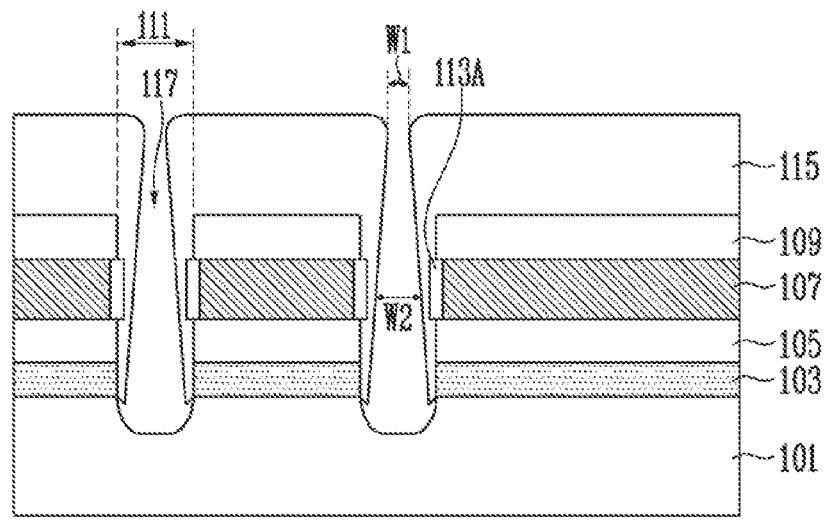

Referring to FIG. 6C, an etch barrier pattern 115 may be formed. The etch barrier pattern 115 may have an overhang structure. The etch barrier pattern 115 may extend onto sidewalls of the first channel holes 111 to cover the gate insulating layer 113A, and open a bottom surface of each of the first channel holes 111. An opening 117 having an upper end and a lower end may be defined by the overhang structure of the etch barrier pattern 115. The upper end of the opening 117 may have a first width W1, the lower end of the opening 117 may have a second width W2 wider than the first width W1.

The process of forming the etch barrier pattern 115 may include a process of depositing an amorphous carbon layer through a deposition process having a low step coverage and a process of removing a portion of the amorphous carbon layer to expose the bottom surface of each of the first channel holes 111.

Subsequently, a dummy insulating layer 113B shown in FIG. 6B may be removed through the opening 117 defined by the etch barrier pattern 115. Subsequently, the etch barrier pattern 115 may be selectively removed such that the gate insulating layer 113A is exposed.

Figure 6D:
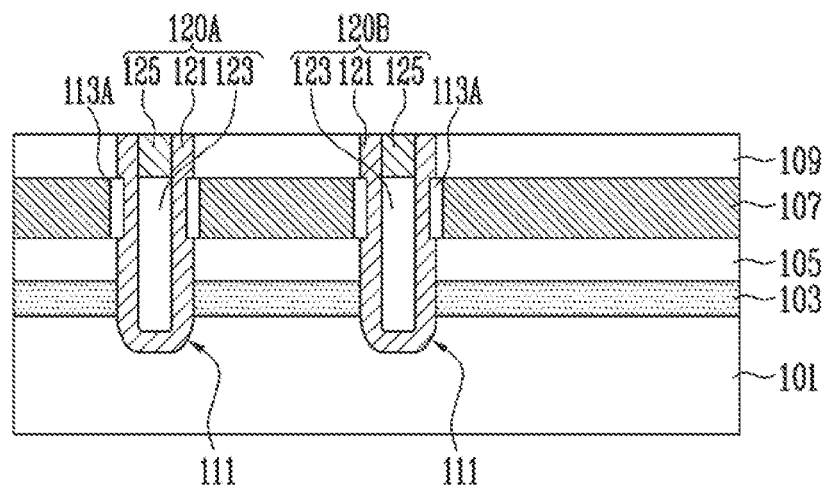

Referring to FIG. 6D, source channels 120A and 120B may be formed to be in contact with the sacrificial substrate 101. The source channels 120A and 120B may respectively fill the first channel holes 111. Each of the source channels 120A and 120B may be spaced apart from the source select gate layer 107 by the gate insulating layer 113A.

The process of forming the source channels 120A and 120B may include a process of forming a source channel layer 121 on a surface of each of the first channel holes 111 and a process of filling a central region of each of the first channel holes 111, which is opened by the source channel layer 121, with a source core insulating layer 123 and a doped semiconductor pattern 125. The source channel layer 121 may be formed by growing silicon from the sacrificial substrate 101 through an epitaxial process or by depositing a silicon layer. The source core insulating layer 123 may fill a partial region of each of the first channel holes 111 on the source channel layer 121. The doped semiconductor pattern 125 may include at least one of an n-type impurity and a p-type impurity.

A surface of each of the source channels 120A and 120B may be planarized through a planarization process such as a chemical mechanical polishing process. The source channels 120A and 120B may be connected to the ESC (not shown) supporting the sacrificial substrate 101.

FIGS. 7A to 7D are sectional views illustrating a process of forming a preliminary connection structure in accordance with an embodiment of the present disclosure.

Figure 7A:
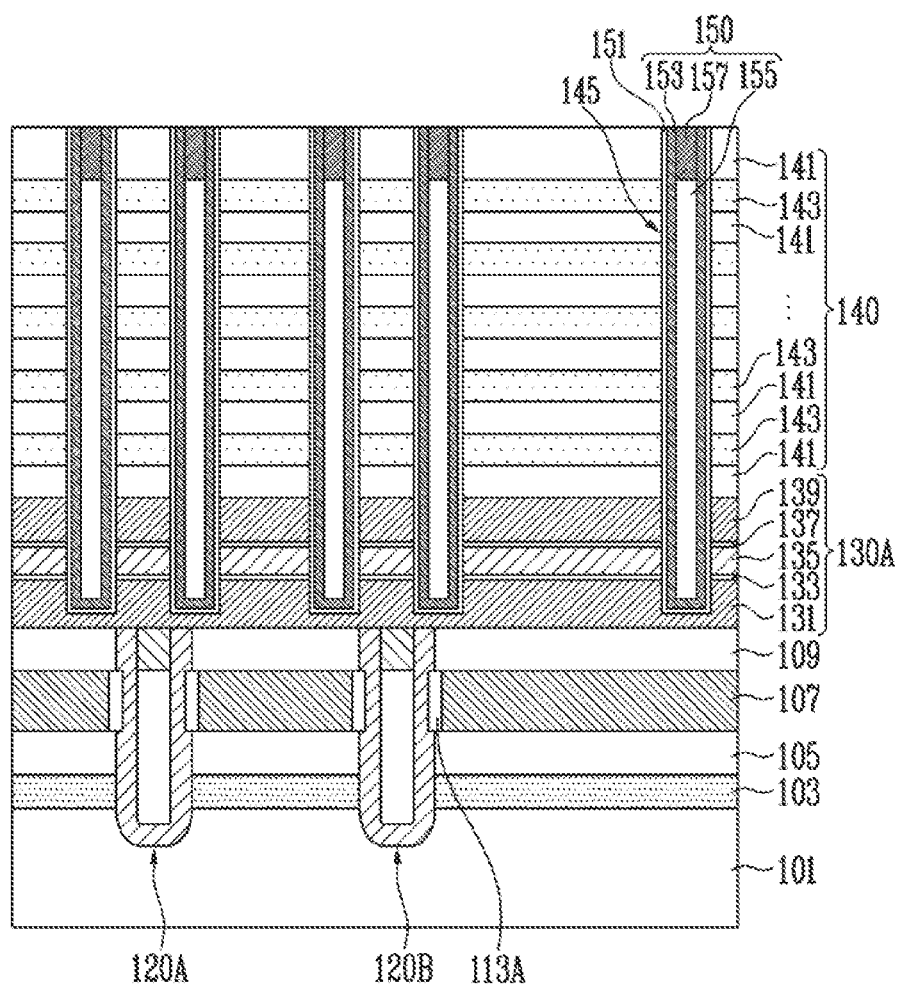
FIGS. 7A to 7D are sectional views illustrating a process of forming a preliminary connection structure in accordance with an embodiment of the present disclosure.

Referring to FIG. 7A, a first stack structure 130A extending to cover the source channels 120A and 120B may be formed on the second insulating layer 109. The first stack structure 130A may include a first conductive layer 131, a first protective layer 133, a sacrificial layer 135, a second protective layer 137, and a second conductive layer 139, which are sequentially stacked on the second insulating layer 109. Each of the first conductive layer 131, the first protective layer 133, the sacrificial layer 135, the second protective layer 137, and the second conductive layer 139 may extend to overlap with the source channels 120A and 120B. The first conductive layer 131, the second conductive layer 139, and the sacrificial layer 135 may include silicon, and the first protective layer 133 and the second protective layer 137 may include an oxide layer.

Subsequently, a second stack structure 140 may be formed on the first stack structure 130A. The second stack structure 140 may include first material layers 141 and second material layers 143, which are alternately stacked on the first stack structure 130A. In an embodiment, the first material layers 141 may be made of an insulating material for the interlayer insulating layers 51 shown in FIGS. 4A and 4B, and the second material layers 143 may be made of a conductive material for the conductive patterns 53 shown in FIGS. 4A and 4B. In another embodiment, the first material layers 141 may be made of an insulating material for the interlayer insulating layers 51 shown in FIGS. 4A and 4B, and the second material layers 143 may be made of a sacrificial insulating material having an etch selectivity with respect to the first material layers 141. In an embodiment, the sacrificial insulating material may include a silicon nitride layer.

Subsequently, second channel holes 145 may be formed. The second channel holes 145 may penetrate the second stack structure 140 and extend into the first stack structure 130A. The second channel holes 145 may penetrate the second conductive layer 139, the second protective layer 137, the sacrificial layer 135, and the first protective layer 133 of the first stack structure 130A. The second channel holes 145 may have a bottom surface disposed at the inside of the first conductive layer 131.

During an etching process of the first stack structure 130A and the second stack structure 140, which is performed to form the second channel holes 145, a ground voltage from the ESC (not shown) of the semiconductor manufacturing apparatus may be applied to the sacrificial substrate 101. A thickness of the first protective layer 133 and the second protective layer 137 may be formed as a thickness thin enough not to block movement of charges. In an embodiment, the thickness of the first protective layer 133 and the second protective layer 137 may be formed as a thickness of 80 Å or less. Accordingly, during the etching process of the first stack structure 130A and the second stack structure 140, charges accumulated in the first conductive layer 131, the sacrificial layer 135, and the second conductive layer 139 of the first stack structure 130A may be discharged through the sacrificial substrate 101 via the source channels 120A and 120B.

In accordance with the embodiment of the present disclosure, charges accumulated in the first stack structure 130A during the etching process of the first stack structure 130A and the second stack structure 140 are discharged through the source channels 120A and 120B in contact with the sacrificial substrate 101. Thus, in accordance with the embodiment of the present disclosure, an arcing phenomenon may be mitigated or prevented.

Continuously, a memory layer 151 may be formed on a surface of each of the second channel holes 145. The memory layer 151 may include the blocking insulating layer BI, the data storage layer DS, and the tunnel insulating layer TI, which are shown in FIG. 5A.

Subsequently, vertical channels 150 filling the second channel holes 145 may be formed on the memory layer 151. The process of forming the vertical channels 150 may include a process of forming a channel layer 153 on a surface of the memory layer 151 and a process of filling a central region of each of the second channel holes 145, which is opened by the channel layer 153, with a core insulating layer 155 and a doped semiconductor pattern 157. The channel layer 153 may include a semiconductor layer. In an embodiment, the channel layer 153 may include undoped silicon. In an embodiment, a portion of the channel layer 153 surrounding the doped semiconductor pattern 157 may include an impurity the same as an impurity of the doped semiconductor pattern 157. In an embodiment, the doped semiconductor pattern 157 may include n-type doped silicon.

Figure 7B:
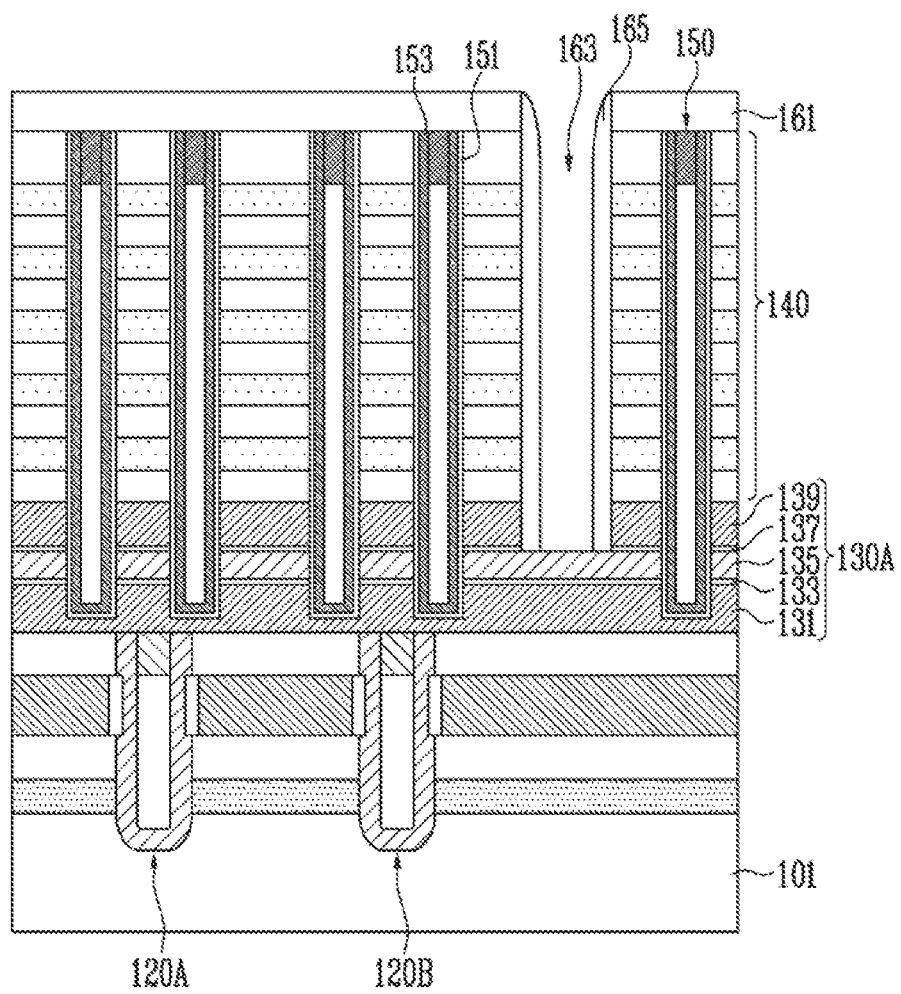

Referring to FIG. 7B, a third insulating layer 161 may be formed on the second stack structure 140 penetrated by the vertical channels 150. Subsequently, a first slit 163 may be formed. The first slit 163 may penetrate the third insulating layer 161 and the second stack structure 140. The first slit 163 may penetrate the second conductive layer 139 and the second protective layer 137 of the first stack structure 130A to expose the sacrificial layer 135 of the first stack structure 130A.

Subsequently, a sidewall protective layer 165 may be formed on a sidewall of the first slit 163. The sidewall protective layer 165 may include a material having an etch selectivity with respect to the sacrificial layer 135. In an embodiment, the sidewall protective layer 165 may include at least one of an oxide layer and a nitride layer.

Figure 7C:
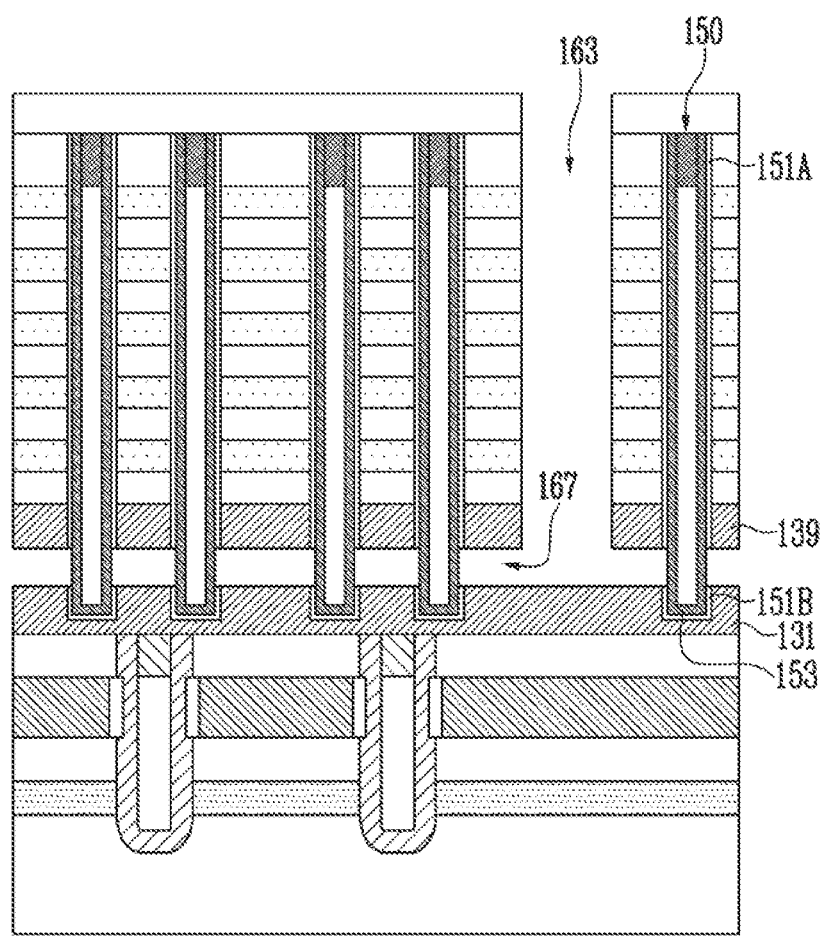

Referring to FIG. 7C, a first opening 167 may be formed. The first opening 167 may expose a sidewall of each of the vertical channels 150.

The process of forming the first opening 167 may include a process of removing the sacrificial layer 135 shown in FIG. 7B through the first slit 163 and a process of removing a portion of the memory layer 151 to expose the channel layer 153. While the sacrificial layer 135 is removed, the first conductive layer 131 and the second conductive layer 139 may be protected by the first protective layer 133 and the second protective layer 137, which are shown in FIG. 7B. A portion of the memory layer 151 may be removed through a region in which the sacrificial layer 135 is removed. While the portion of the memory layer 151 is removed, the first protective layer 133 and the second protective layer 137, which are shown in FIG. 7B, may be removed.

After the channel layer 153 is exposed through the first opening 167, the sidewall protective layer 165 shown in FIG. 7B may be removed.

The memory layer 151 may be isolated into a first memory pattern 151A and a second memory pattern 151B by the first opening 167.

Figure 7D:
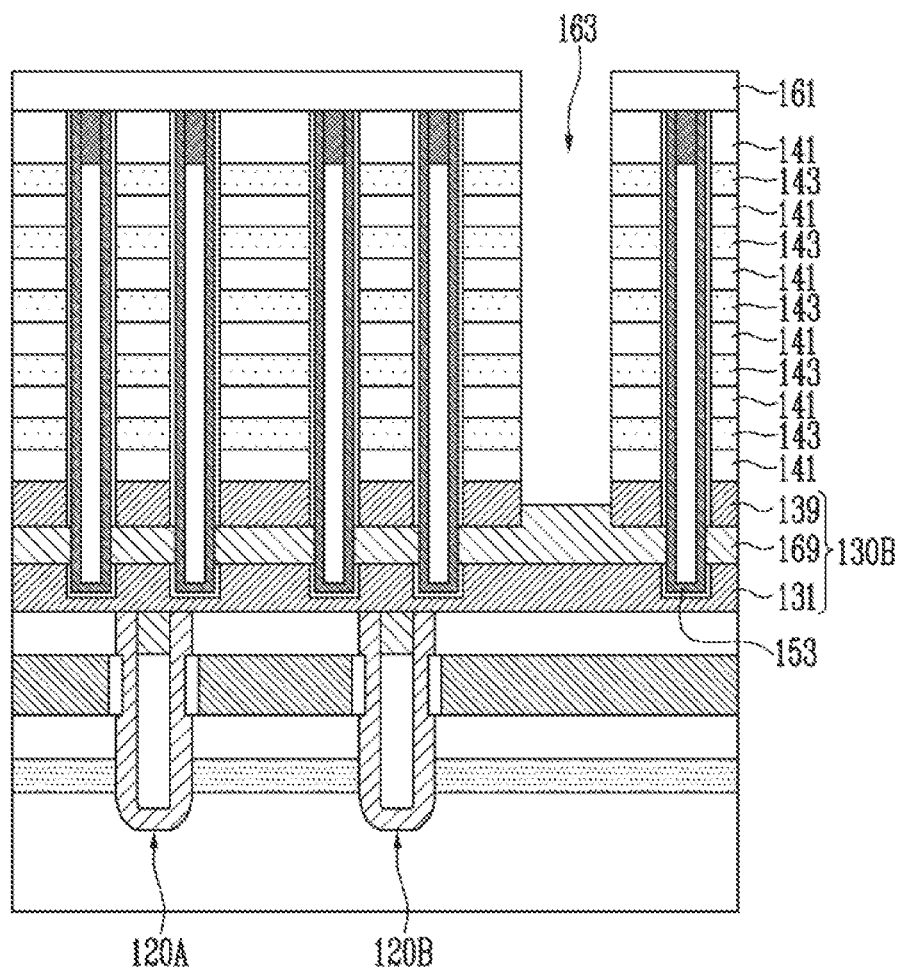

Referring to FIG. 7D, a channel contact layer 169 may be formed. The channel contact layer 169 may fill the first opening 167 shown in FIG. 7C and be in contact with the channel layer 153. The channel contact layer 169 may include a doped semiconductor layer. In an embodiment, the channel contact layer 169 may include doped silicon.

Through the processes described with reference to FIGS. 7A to 7D, a preliminary connection structure 130B may be formed. The preliminary connection structure 130B may connect the channel layer 153 to the source channels 120A and 120B. The preliminary connection structure 130B may include the channel contact layer 169, the first conductive layer 131, and the second conductive layer 139. The channel contact layer 169 may be in contact with the channel layer 153. The first conductive layer 131 may be in contact with a bottom surface of the channel contact layer 169 and be in contact with the source channels 120A and 120B. The second conductive layer 139 may be in contact with a top surface of the channel contact layer 169 and be penetrated by the first slit 163.

Figure 8A:
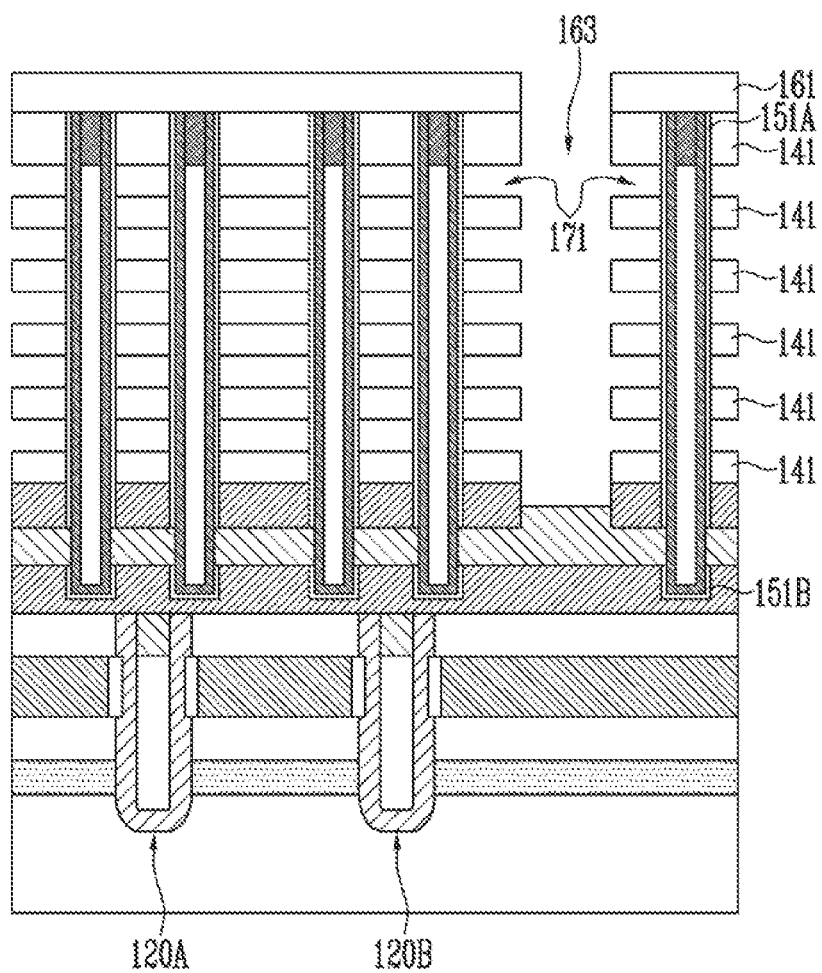
FIGS. 8A and 8B are sectional views illustrating a process of forming conductive patterns in accordance with an embodiment of the present disclosure.
Figure 8B:
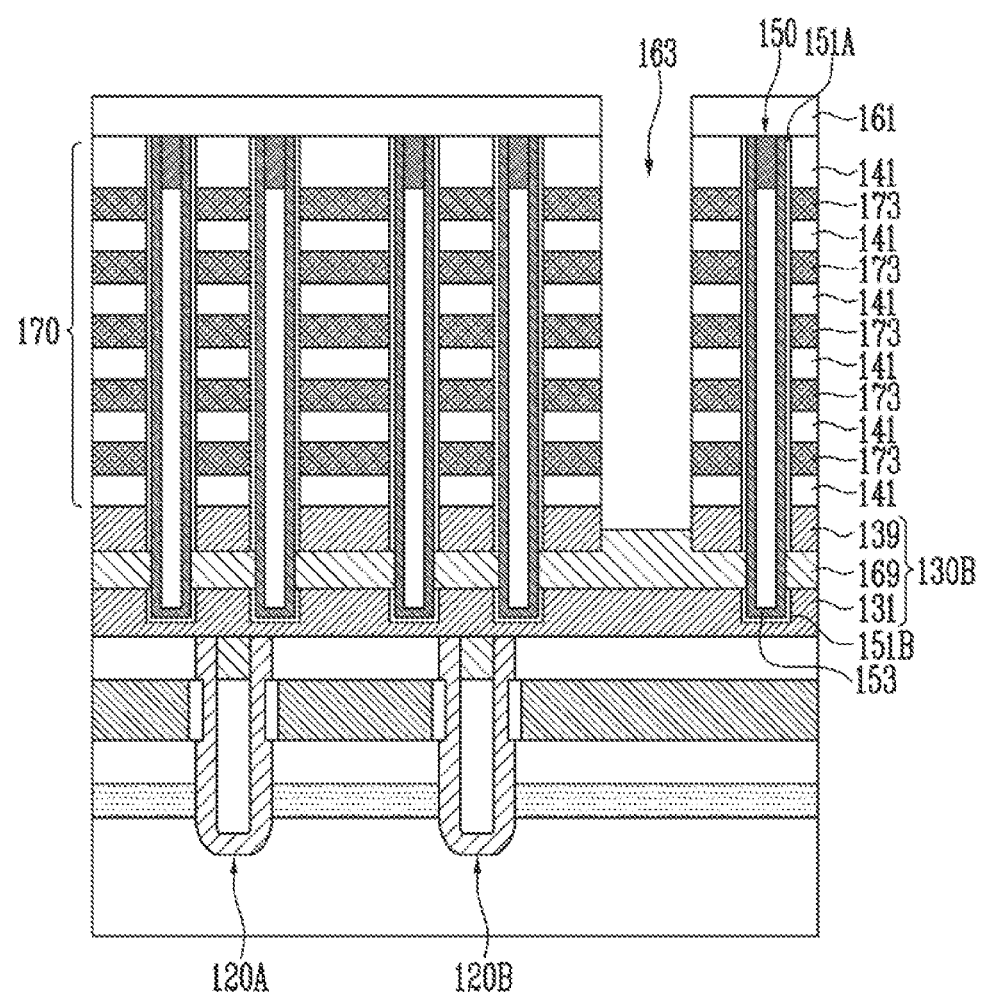
Figure 9:
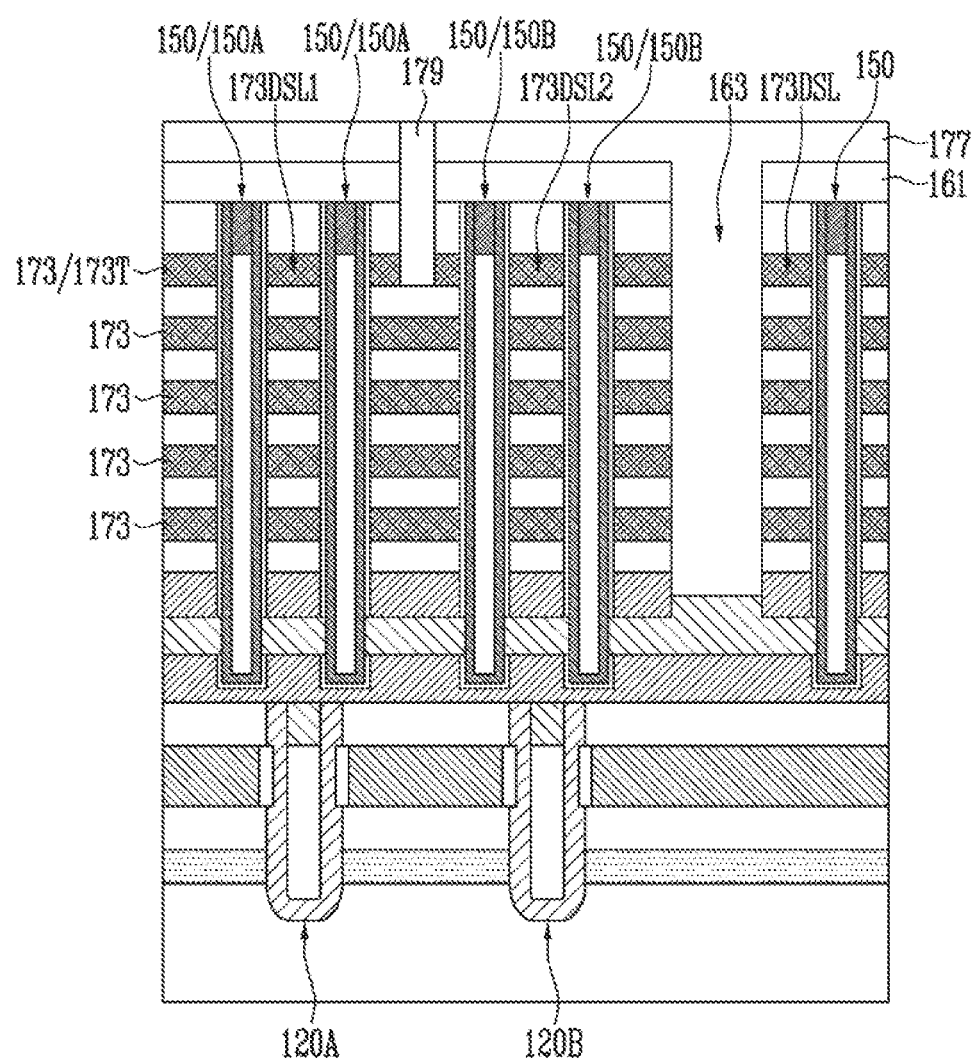
FIG. 9 is a sectional view illustrating a process of forming drain select lines in accordance with an embodiment of the present disclosure.

In an embodiment in which the first material layers 141 are made of an insulating material and the second material layers 143 are made of a conductive material, processes shown in FIG. 9 may be continuously performed. In an embodiment in which the first material layers 141 are made of an insulating material and the second material layers 143 are made of a sacrificial insulating material, the processes shown in FIG. 9 may be performed after processes shown in FIGS. 8A and 8B are performed.

FIGS. 8A and 8B are sectional views illustrating a process of forming conductive patterns in accordance with an embodiment of the present disclosure.

Referring to FIG. 8A, second openings 171 may be defined between the first material layers 141 by selectively removing the second material layers 143 shown in FIG. 7D through the first slit 163. The first memory pattern 151A may be exposed through the second openings 171.

Referring to FIG. 8B, the second openings 171 shown in FIG. 8A may be respectively filled with conductive patterns 173. The conductive patterns 173 may extend to surround each of the vertical channels 150 with the first memory pattern 151A interposed therebetween. The conductive patterns 173 may be spaced apart from each other in an extending direction of the vertical channels 150 by the first material layers 141.

Through the processes shown in FIGS. 7A to 7D and the processes shown in FIGS. 8A and 8B, the preliminary connection structure 130B and a cell stack structure 170 may be formed. The cell stack structure 170 may include the vertical channels 150 and the conductive patterns 173. The vertical channels 150 may be in contact with the preliminary connection structure 130B. The conductive patterns 173 may surround the vertical channels 150 and be stacked to be spaced apart from each other.

As described with reference to FIGS. 8A and 8B, the second material layers may be replaced with the conductive patterns 173 so as to form the cell stack structure 170. Although not shown in the drawings, the process of replacing the second material layers with the conductive patterns 173 may be performed before the sidewall protective layer 165 shown in FIG. 7B is formed.

FIG. 9 is a sectional view illustrating a process of forming drain select lines in accordance with an embodiment of the present disclosure.

Referring to FIG. 9, a fourth insulating layer 177 may be formed. The fourth insulating layer 177 may fill the first slit 163, and extend over the third insulating layer 161. Subsequently, a drain slit insulating layer 179 may be formed. The drain slit insulating layer 179 may isolate at least one of the conductive patterns 173 into drain select lines 173DSL1, 173DSL2, and 173DSL. In an embodiment, the drain slit insulating layer 179 may penetrate the third insulating layer 161 and the fourth insulating layer 177, and extend to penetrate an uppermost conductive pattern 173T among the conductive patterns 173. The conductive patterns 173 overlapping with the drain slit insulating layer 179 may remain as word lines.

The vertical channels 150 may include a first vertical channel 150A and a second vertical channel 150B. The drain slit insulating layer 179 may isolate the uppermost conductive pattern 173T into a first drain select line 173DSL1 surrounding the first vertical channel 150A and a second drain select line 173DSL2 surrounding the second vertical channel 150B, by penetrating the uppermost conductive pattern 173T between the first vertical channel 150A and the second vertical channel 150B.

Figure 10:
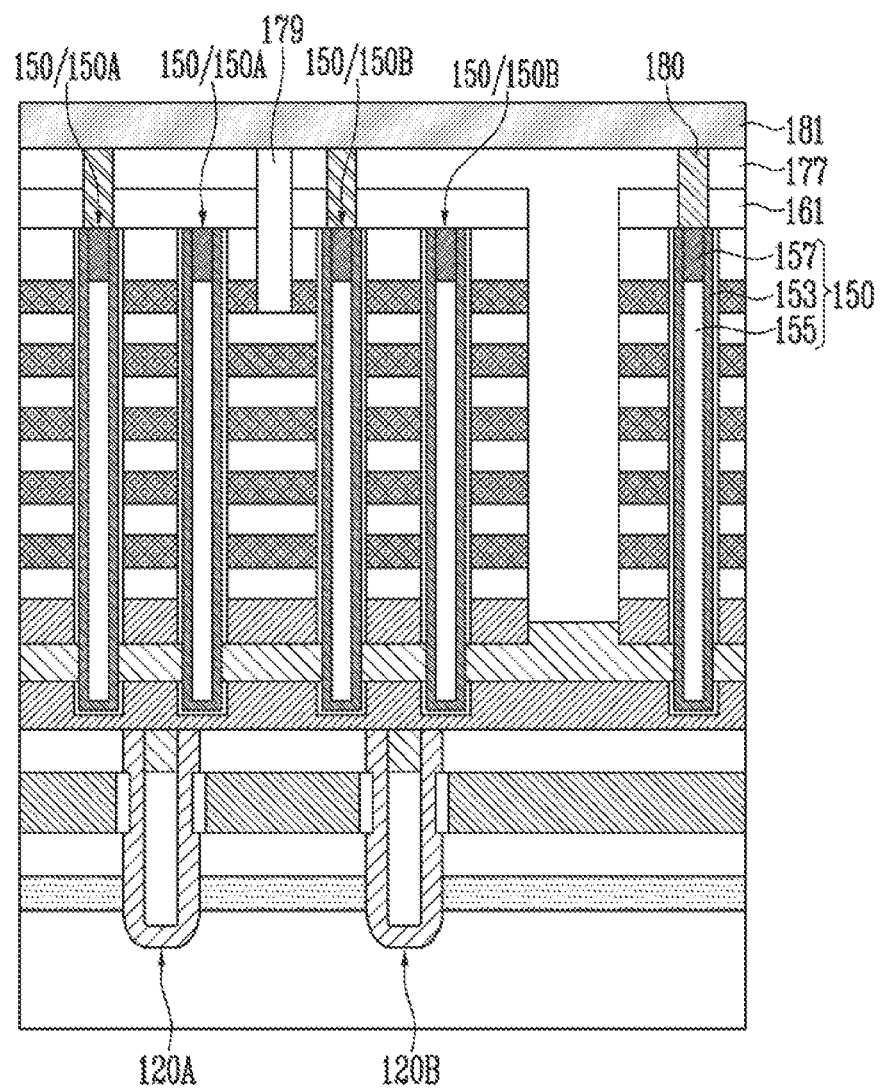
FIG. 10 is a sectional view illustrating a process of forming a bit line in accordance with an embodiment of the present disclosure.

FIG. 10 is a sectional view illustrating a process of forming a bit line in accordance with an embodiment of the present disclosure.

Referring to FIG. 10, contact plugs 180 may be formed, which penetrate the third insulating layer 161 and the fourth insulating layer 177. Subsequently, a bit line 181 connected to the contact plugs 180 may be formed. The bit line 181 may be connected to the vertical channels 150 via the contact plugs 180. The bit line 181 may be connected to a pair of first and second vertical channels 150A and 150B.

FIG. 10 illustrates only the contact plugs 180 connected to one bit line 181. Although not shown in the drawing, another pair of first and second vertical channels 150A and 150B, which are not connected to the contact plugs 180, among the vertical channels 150 shown in FIG. 10 may be connected to another bit line via other contact plugs.

Figure 11:
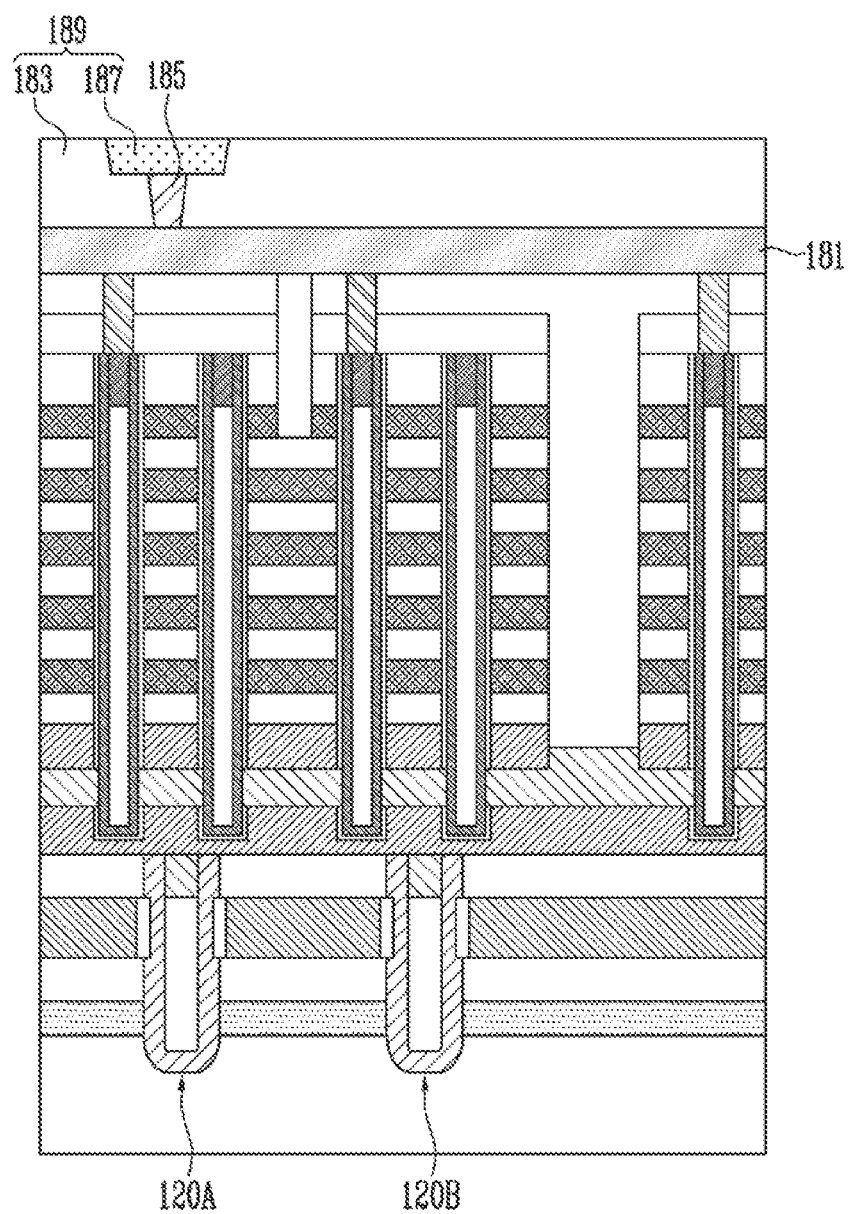
FIG. 11 is a sectional view illustrating a process of forming a first bonding structure in accordance with an embodiment of the present disclosure.

FIG. 11 is a sectional view illustrating a process of forming a first bonding structure in accordance with an embodiment of the present disclosure.

Referring to FIG. 11, a first bonding structure 189 may be formed on the bit line 181. The first bonding structure 189 may include a first insulating structure 183 and a first bonding pad 187. A first interconnection structure 185 may be buried in the first insulating structure 183. In an embodiment, the first interconnection structure 185 may be connected to the bit line 181. The first insulating structure 183 may include a multi-layered insulating layer including two layers or more. The first bonding pad 187 may be connected to the bit line 181 via the first interconnection structure 185. The first bonding pad 187 may include a metal.

Figure 12:
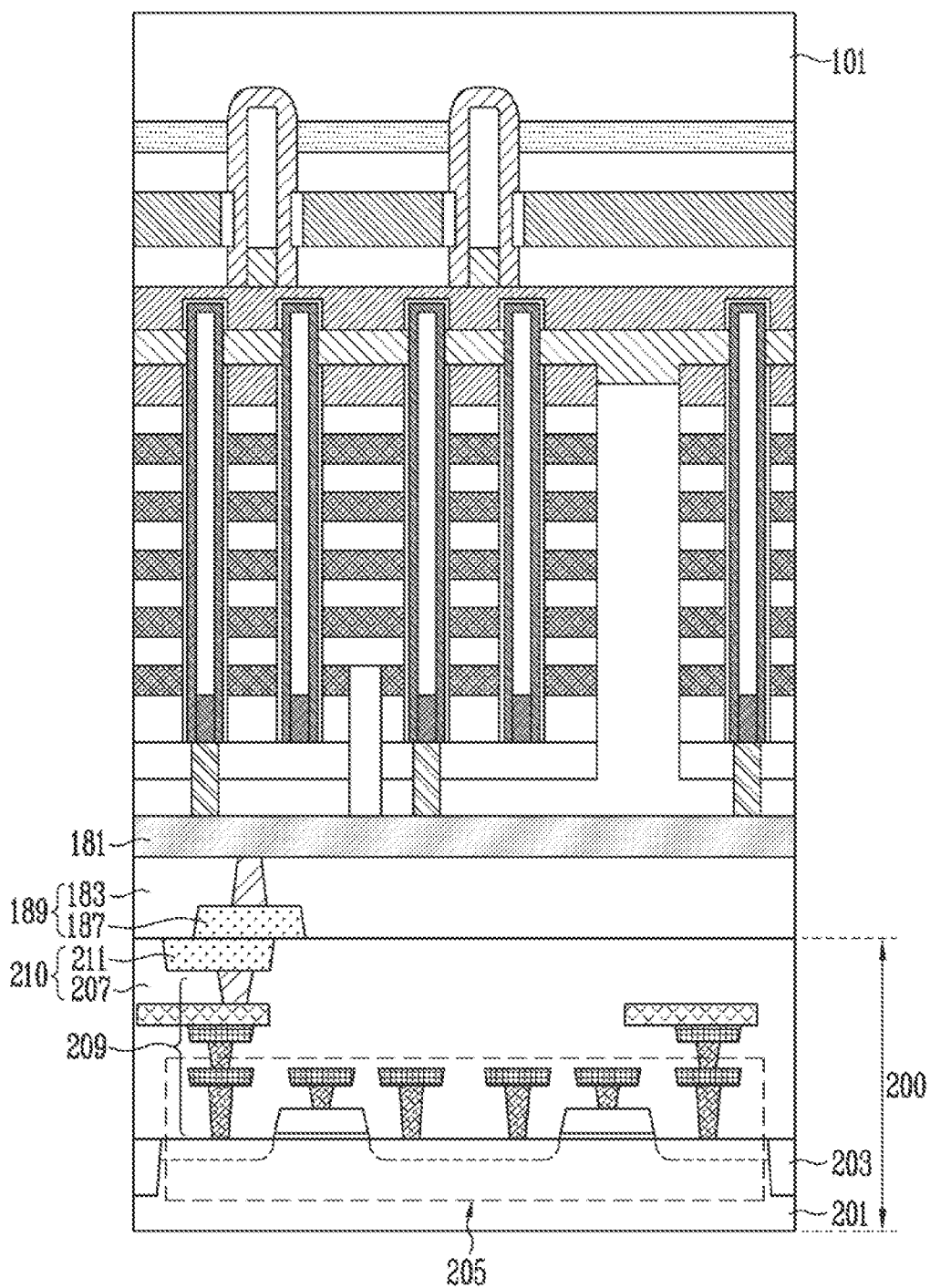
FIG. 12 is a sectional view illustrating a bonding process in accordance with an embodiment of the present disclosure.

FIG. 12 is a sectional view illustrating a bonding process in accordance with an embodiment of the present disclosure.

Referring to FIG. 12, before the bonding process is performed, a peripheral circuit layer 200 may be provided. The peripheral circuit layer 200 may include a substrate 201 including isolation layers 203 and a peripheral circuit 205, a second interconnection structure 209 connected to the peripheral circuit 205, and a second bonding structure 210.

The second bonding structure 210 may include a second insulating structure 207 and a second bonding pad 211. The second insulating structure 207 may be disposed on the substrate 201 to cover the peripheral circuit 205. The second interconnection structure 209 may be buried in the second insulating structure 207. The second insulating structure 207 may include a multi-layered insulating layer including two layer or more. The second bonding pad 211 may be connected to the peripheral circuit 205 via the second interconnection structure 209. The second bonding pad 211 may include a metal.

The first bonding structure 189 may be disposed to face the second bonding structure 210. The first bonding structure 189 and the second bonding structure 210 may be bonded to each other. The first bonding pad 187 may be bonded to the second bonding pad 211. The first insulating structure 183 may be bonded to the second insulating structure 207.

Figure 13A:
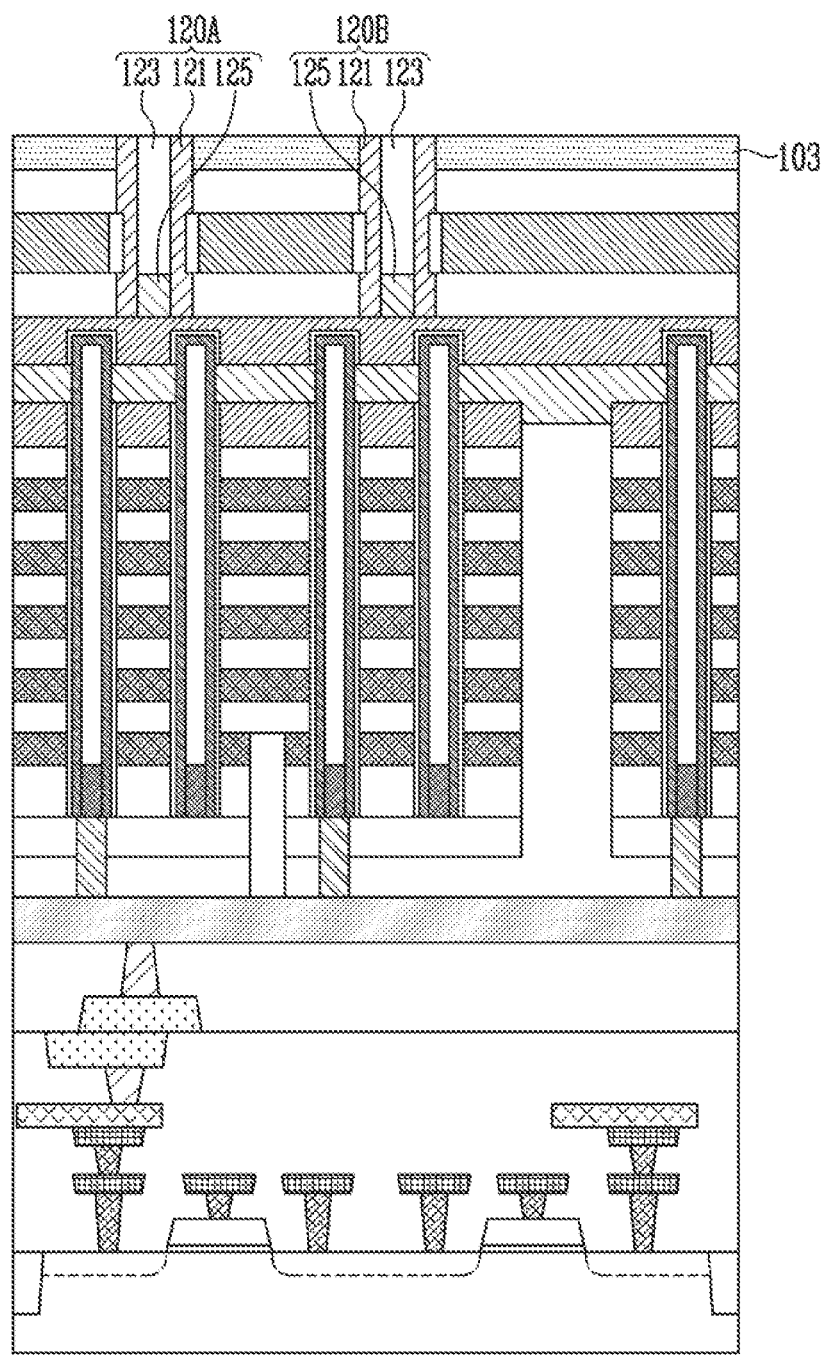
FIGS. 13A and 13B are sectional views illustrating a process of forming source select lines and connection patterns in accordance with an embodiment of the present disclosure.
Figure 13B:
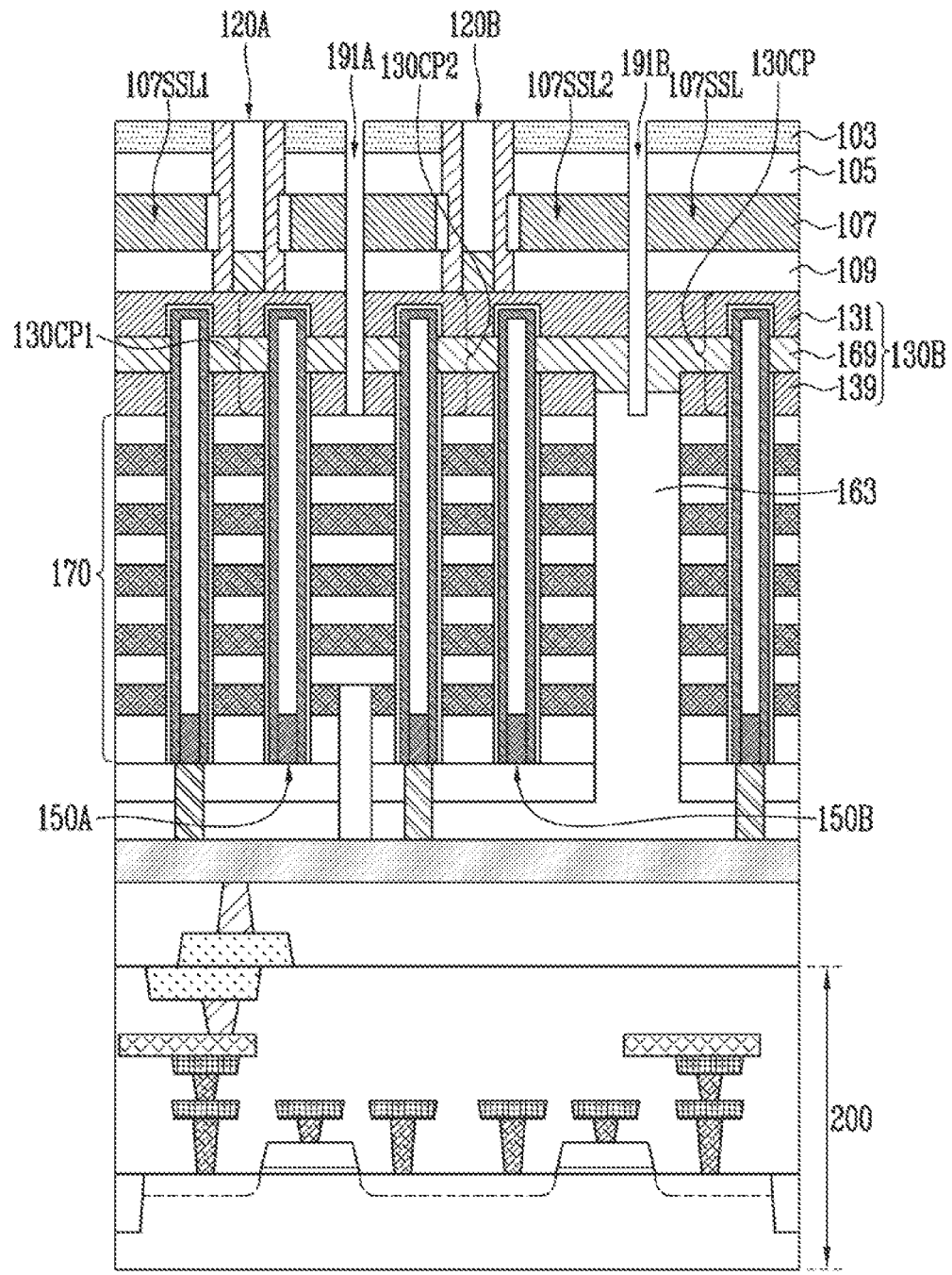

FIGS. 13A and 13B are sectional views illustrating a process of forming source select lines and connection patterns in accordance with an embodiment of the present disclosure.

Referring to FIG. 13A, the sacrificial substrate 101 shown in FIG. 12 may be removed. In an embodiment, the sacrificial substrate 101 may be removed by using at least one of a chemical mechanical polishing process using a slurry having an etch selectivity with respect to the etch stop layer 103 and a wet etching process using an etchant having an etch selectivity with respect to the etch stop layer 103.

Because the sacrificial substrate 101 is removed, the source channels 120A and 120B may be exposed. While the sacrificial substrate 101 is removed, a portion of the source channel layer 121 may be removed. Accordingly, the source core insulating layer 123 of each of the source channels 120A and 120B may be exposed.

Referring to FIG. 13B, a source slit 191A and a second slit 191B may be formed. The source slit 191A and a second slit 191B may penetrate the source select gate layer 107 and the preliminary connection structure 130B. The source select gate layer 107 and the preliminary connection structure 130B may overlap with the peripheral circuit layer 200 with the cell stack structure 170 interposed between the preliminary connection structure 130B and the peripheral circuit layer 200. Each of the source slit 191A and the second slit 191B may penetrate the etch stop layer 103, the first insulating layer 105, the second insulating layer 109, the source select gate layer 107, and the preliminary connection structure 130B.

The source select gate layer 107 may be isolated into source select lines 107SSL1, 107SSL2, and 107SSL by the source slit 191A and the second slit 191B. The preliminary connection structure 130B may be isolated into connection patterns 130CP1, 130CP2, and 130CP by the source slit 191A and the second slit 191B.

The second slit 191B may overlap with the first slit 163. The second slit 191B may extend to penetrate the first conductive layer 131 and the channel contact layer 169 of the preliminary connection structure 130B, and extend to the inside of the first slit 163.

The source channels 120A and 120B may include a first source channel 120A and a second source channel 120B. The source slit 191A may penetrate the source select gate layer 107 between the first source channel 120A and the second source channel 120B. The source select gate layer 107 may be isolated into a first source select line 107SSL1 surrounding the first source channel 120A and a second source select line 107SSL2 surrounding the second source channel 120B by the source slit 191A.

The source slit 191A may extend between the first vertical channel 150A and the second vertical channel 150B. The preliminary connection structure 130B may be isolated into a first connection pattern 130CP1 surrounding the first vertical channel 150A and a second connection pattern 130CP2 surrounding the second vertical channel 150B by the source slit 191A.

Figure 14:
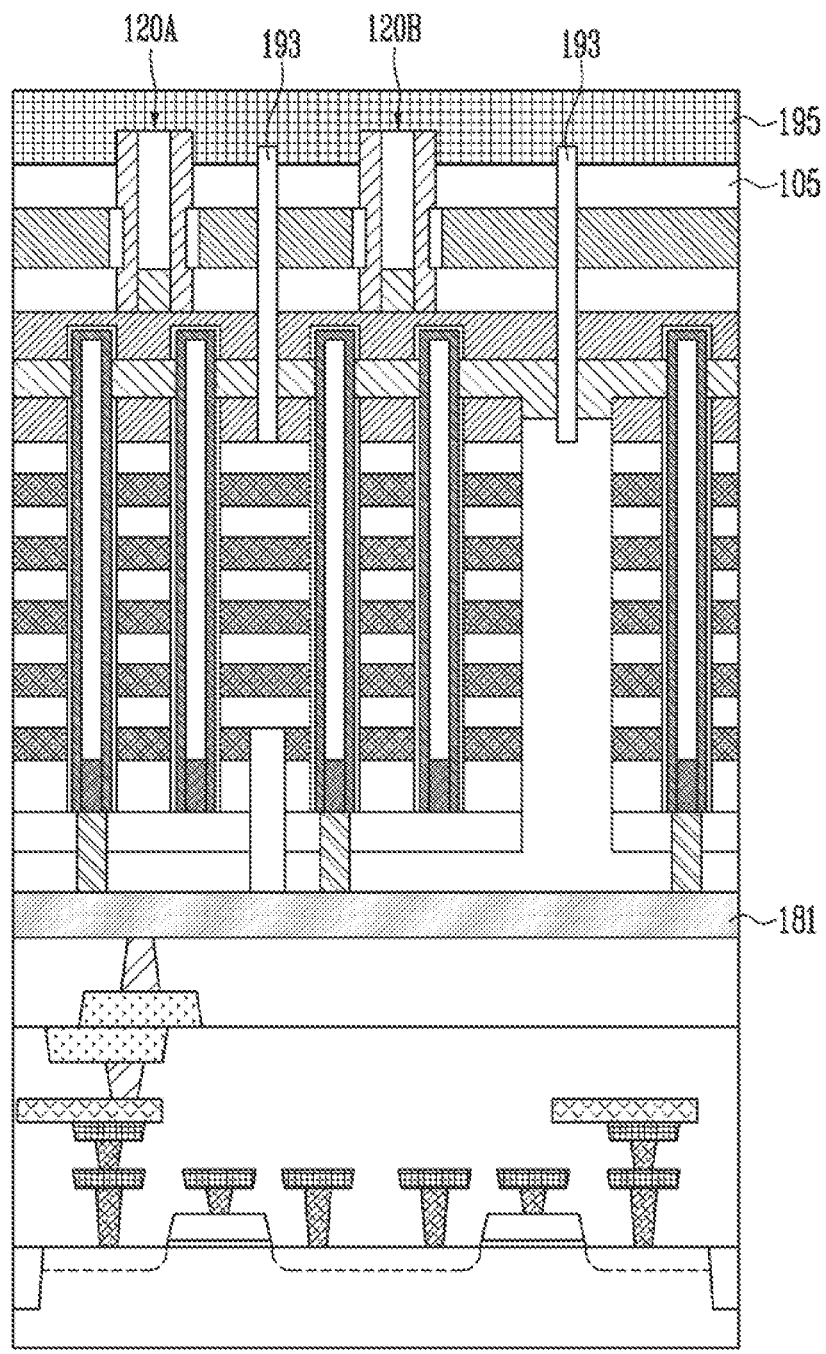
FIG. 14 is a sectional view illustrating a process of forming a source layer in accordance with an embodiment of the present disclosure.

FIG. 14 is a sectional view illustrating a process of forming a source layer in accordance with an embodiment of the present disclosure.

Referring to FIG. 14, before a source layer 195 is formed, the etch stop layer 103 shown in FIG. 13B may be removed, after each of the source slit 191A and the second slit 191B, which are shown in FIG. 13B, is filled with a source slit insulating layers 193.

Subsequently, the source layer 195 may be formed, which is connected to the first source channel 120A and the second source channel 120B, which remain to farther protrude than the first insulating layer 105. The source layer 195 may extend above the bit line 181 to overlap with the first source channel 120A and the second source channel 120B, which are interposed between the source layer 195 and the bit line 181. Although not shown in the drawing, the source layer 195 may be isolated in a plane unit.

Subsequently, subsequent processes for forming the source contact plugs SCT and the second source layer SL2, which are shown in FIG. 4A, may be performed.

Figure 15A:
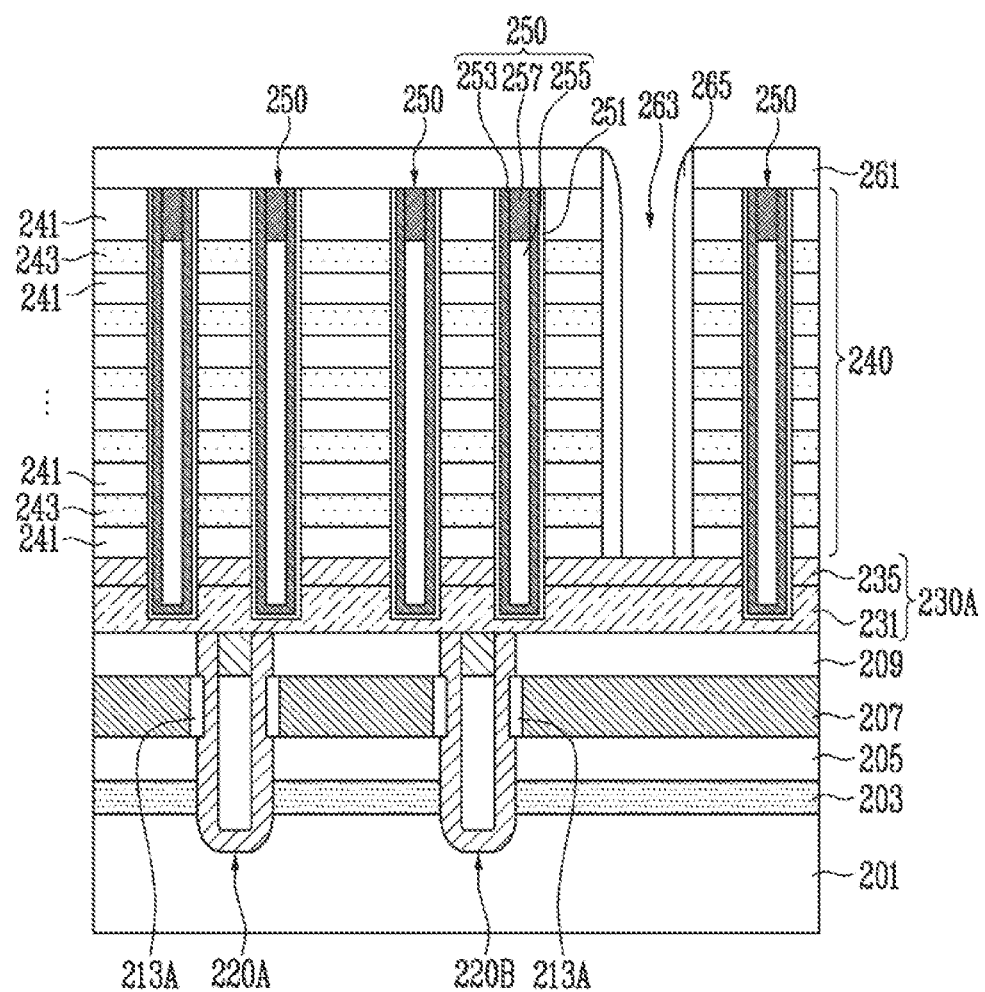
FIGS. 15A and 15B are sectional views illustrating a process of forming a preliminary connection structure in accordance with an embodiment of the present disclosure.
Figure 15B:
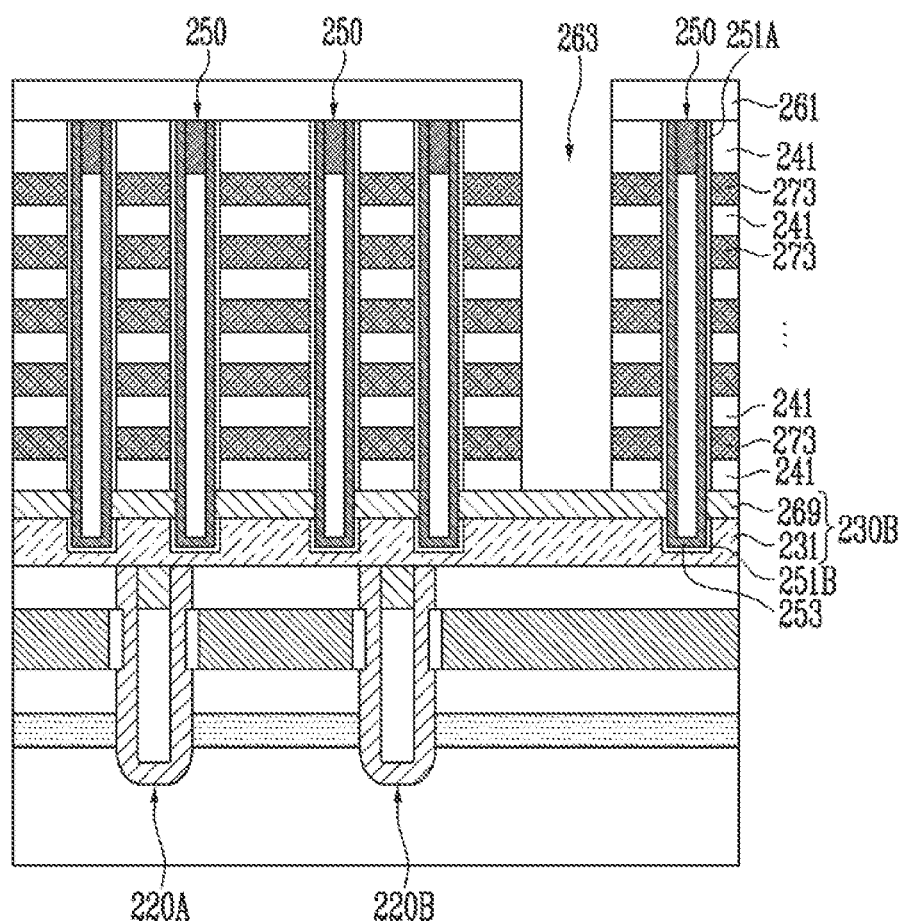

FIGS. 15A and 15B are sectional views illustrating a process of forming a preliminary connection structure in accordance with an embodiment of the present disclosure.

Referring to FIG. 15A, before a preliminary connection structure is formed, source channels 220A and 220B may be formed. The source channels 220A and 220B may be in contact with the sacrificial substrate 201. The source channels 220A and 220B may extend to penetrate the etch stop layer 203, the first insulating layer 205, the source select gate layer 207, and the second insulating layer 209, which are stacked on the sacrificial substrate 201. A sidewall of each of the source channels 220A and 220B may be surrounded by a gate insulating layer 213A. The gate insulating layer 213A may be disposed between each of the source channels 220A and 220B and the source select gate layer 207.

The sacrificial substrate 201, the etch stop layer 203, the first insulating layer 205, the source select gate layer 207, the second insulating layer 209, the source channels 220A and 220B, and the gate insulating layer 213A, which are described above, may be formed by using the processes described with reference to FIGS. 6A to 6D.

Subsequently, a first stack structure 230A may be formed on the second insulating layer 209. The first stack structure 230A may include a conductive layer 231 extending to cover the source channels 200A and 220B and a sacrificial layer 235 stacked on the conductive layer 231. The conductive layer 231 may have tolerance against heat generated in a subsequent process, and include a conductive material which may provide an ohmic contact. In an embodiment, the conductive layer 231 may include tungsten silicide. The sacrificial layer 235 may include a material having an etch selectivity with respect to the conductive layer 231. In an embodiment, the sacrificial layer 235 may include silicon.

Subsequently, a second stack structure 240 may be formed on the first stack structure 230A. The second stack structure 240 may include first material layers 241 and second material layers 243, which are alternately stacked on the first stack structure 230A as described with reference to FIG. 7A.

Subsequently, a memory layer 251 and a vertical channel 250 may be formed. The memory layer 251 and the vertical channel 250 may penetrate the second stack structure 240 and extend into the conductive layer 231 of the first stack structure 230A. The memory layer 251 and the vertical channel 250 may be formed by using the processes described with reference to FIG. 7A. The vertical channel 250 may include a channel layer 253, a core insulating layer 256, and a doped semiconductor pattern 257 as described with reference to FIG. 7A.

Subsequently, as described with reference to FIG. 7B, a third insulating layer 261 may be formed on the second stack structure 240, and a first slit 263 may be formed, which penetrates the third insulating layer 261 and the second stack structure 240. The first slit 263 may expose the sacrificial layer 235 of the first stack structure 230A.

Subsequently, a sidewall protective layer 265 may be formed on a sidewall of the first slit 263. The sidewall protective layer 265 may include a material having an etch selectivity with respect to the sacrificial layer 235. In an embodiment, the sidewall protective layer 265 may include at least one of an oxide layer and a nitride layer.

Referring to FIG. 15B, similarly to as described with reference to FIG. 7C, portions of the sacrificial layer 235 and the memory layer 251 may be removed in a state in which the second stack structure 240 shown in FIG. 15A is protected by the sidewall protective layer 265. Accordingly, the memory layer may be isolated into a first memory pattern 251A and a second memory pattern 251B, and the channel layer 253 may be exposed between the first memory pattern 251A and the second memory pattern 251B.

Subsequently, similarly to as described with reference to FIG. 7C, a channel contact layer 269 may be formed. The channel contact layer 269 may be disposed between the first memory pattern 251A and the second memory pattern 251B and is in contact with the channel layer 253. The channel contact layer 269 may fill a region in which the sacrificial layer is removed.

Through the processes described with reference to FIGS. 15A and 15B, a preliminary connection structure 230B may be formed. The preliminary connection structure 230B may connect the channel layer 253 to the source channels 220A and 220B.

Subsequently, the forming process of a conductive patterns 273, which is described with reference to FIGS. 8A and 8B, the forming process of drain select lines, which is described with reference to FIG. 9, the forming process of a bit line, which is described with reference to FIG. 10, the forming process of a first bonding structure, which is described with reference to FIG. 11, the bonding process described with reference to FIG. 12, the forming process of source select lines and connection patterns, which is described with reference to FIGS. 13A and 13B, and the forming process of a source layer, which is described with reference to FIG. 14, may be sequentially performed. Subsequently, subsequent processes for forming the source contact plugs SCT and the second source layer SL2, which are shown in FIG. 4A, may be performed.

Figure 16:
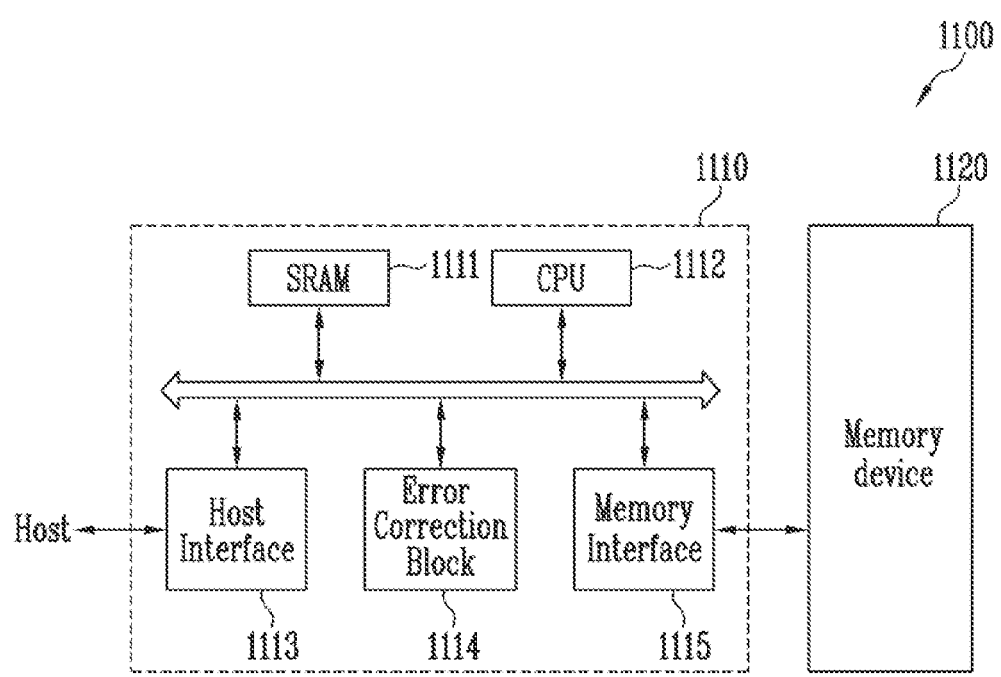
FIG. 16 is a block diagram illustrating a configuration of a memory system in accordance with an embodiment of the present disclosure.

FIG. 16 is a block diagram illustrating a configuration of a memory system 1110 in accordance with an embodiment of the present disclosure.

Referring to FIG. 16, the memory system 1100 includes a memory device 1120 and a memory controller 1110.

The memory device 1120 may include: a vertical channel connected to a bit line, the vertical channel penetrating a drain select line and a word line; a connection pattern in contact with the vertical channel; a source channel connected to the vertical channel via the connection pattern; and a source select line surrounding the source channel.

The memory device 1120 may be a multi-chip package configured with a plurality of flash memory chips.

The memory controller 1110 controls the memory device 1120, and may include a Static Random Access Memory (SRAM) 1111, a Central Processing Unit (CPU) 1112, a host interface 1113, an error correction block 1114, and a memory interface 1115. The SRAM 1111 is used as an operation memory of the CPU 1112, the CPU 1112 performs overall control operations for data exchange of the memory controller 1110, and the host interface 1113 includes a data exchange protocol for a host connected with the memory system 1100. The error correction block 1114 detects and corrects an error included in a data read from the memory device 1120. The memory interface 1115 interfaces with the memory device 1120. The memory controller 1110 may further include a Read Only Memory (ROM) for storing code data for interfacing with the host, and the like.

Figure 17:
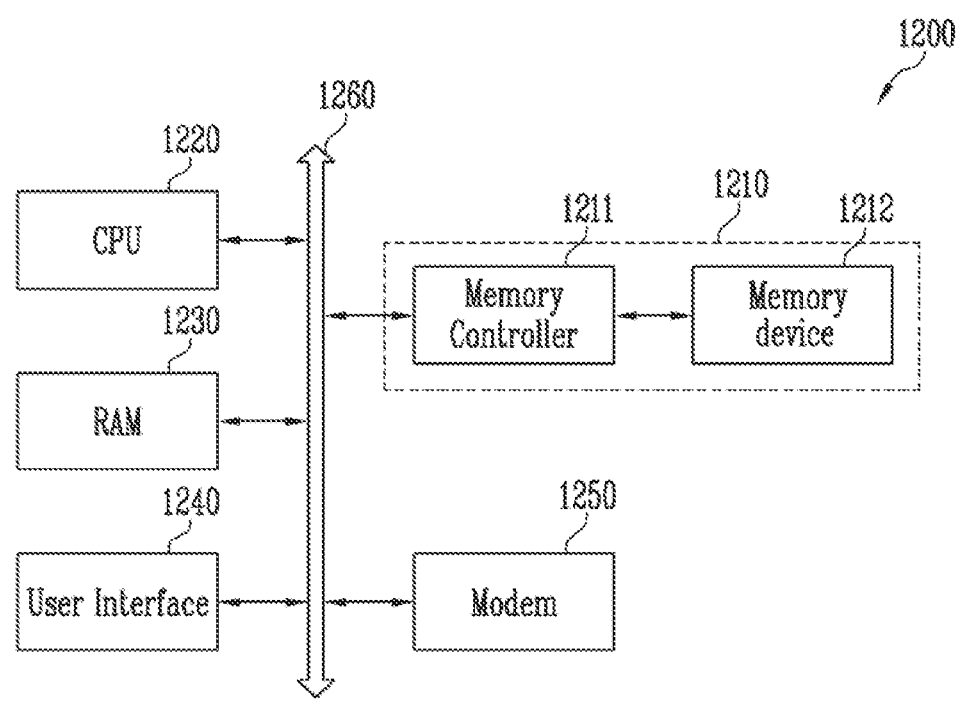
FIG. 17 is a block diagram illustrating a configuration of a computing system in accordance with an embodiment of the present disclosure.

FIG. 17 is a block diagram illustrating a configuration of a computing system 1200 in accordance with an embodiment of the present disclosure.

Referring to FIG. 17, the computing system 1200 may include a CPU 1220, a random access memory (RAM) 1230, a user interface 1240, a modem 1250, and a memory system 1210, which are electrically connected to a system bus 1260. The computing system 1200 may be a mobile device.

The memory system 1210 may include a memory device 1212 and a memory controller 1211. The memory device 1212 may include: a vertical channel connected to a bit line, the vertical channel penetrating a drain select line and a word line; a connection pattern in contact with the vertical channel; a source channel connected to the vertical channel via the connection pattern; and a source select line surrounding the source channel.

In accordance with the present disclosure, charges generated in a manufacturing process of the semiconductor memory device may be discharged through a source channel in contact with a sacrificial substrate, and thus an arcing phenomenon may be mitigated or prevented. Accordingly, the stability of the manufacturing process of the semiconductor memory device may be improved.

In accordance with the present disclosure, an etching process for defining source select lines and connection patterns is performed after the sacrificial substrate is removed. Therefore, the level of difficulty of the manufacturing process of the semiconductor memory device may be lowered.

In accordance with the present disclosure, a vertical channel and the source channel are electrically connected to each other through the connection pattern. Therefore, a current flow path may be formed between a bit line connected to the vertical channel and a common source line connected to the source channel.

What is claimed is:

1. A semiconductor memory device comprising:
    a bit line overlapping with a peripheral circuit layer;
    a source layer over the bit line;
    interlayer insulating layers and conductive patterns alternately stacked in a first direction between the bit line and the source layer;
    vertical channels connected to the bit line, the vertical channels penetrating the interlayer insulating layers and the conductive patterns, the vertical channels protruding farther in the first direction than the stacked interlayer insulating layers and the conductive patterns;
    a connection pattern in contact with a portion of each of the vertical channels that protrudes farther in the first direction than the stacked interlayer insulating layers and the conductive patterns, the connection pattern connecting the vertical channels;
    a source channel in contact with the connection pattern, the source channel extending in the first direction to contact the source layer; and
    a source select line surrounding the source channel and spaced apart from the connection pattern and the source layer so that the source layer is electrically connected to the connection pattern via the source channel depending on a signal applied to the source select line.

2. The semiconductor memory device of claim 1, wherein at least one of the vertical channels does not overlap with the source channel.

3. The semiconductor memory device of claim 1, wherein a width of the source channel is wider than a width of each of the vertical channels.

4. The semiconductor memory device of claim 1, wherein the conductive patterns include:
    a drain select line adjacent to the bit line; and
    a word line disposed between the drain select line and the connection pattern, and
    wherein the word line has a width wider than a width of each of the drain select line, the source select line, and the connection pattern.

5. The semiconductor memory device of claim 1, wherein the connection pattern includes:
    a channel contact layer in contact with the vertical channels, the channel contact layer surrounding a sidewall of each of the vertical channels; and
    a first conductive layer extending along a first surface of the channel contact layer, which faces the source select line, the first conductive layer surrounding each of the vertical channels.

6. The semiconductor memory device of claim 5, wherein the connection pattern further includes a second conductive layer extending along a second surface of the channel contact layer, which faces in a direction opposite to the first surface of the channel contact layer, the second conductive layer surrounding each of the vertical channels.

7. The semiconductor memory device of claim 6, wherein each of the first conductive layer and the second conductive layer includes a doped silicon layer.

8. The semiconductor memory device of claim 5, wherein the first conductive layer includes tungsten silicide.

9. The semiconductor memory device of claim 5, wherein the channel contact layer includes doped silicon.

10. The semiconductor memory device of claim 5, further comprising:
    a first memory pattern surrounding a portion of each of the vertical channels penetrating the stacked interlayer insulating layers and the conductive patterns; and
    a second memory pattern disposed between each of the vertical channels and the first conductive layer, the second memory pattern being spaced part from the first memory pattern by the channel contact layer.

11. The semiconductor memory device of claim 1, wherein the source layer overlaps with the connection pattern with the source channel interposed between the source layer and the connection pattern.

12. The semiconductor memory device of claim 11, wherein the source channel includes:
    a source core insulating layer in contact with the source layer;
    a doped semiconductor pattern disposed between the source core insulating layer and the connection pattern, the doped semiconductor pattern being in contact with the connection pattern; and
    a source channel layer surrounding a sidewall of the source core insulating layer and a sidewall of the doped semiconductor pattern, the source channel layer extending to contact the source layer and the connection pattern.

13. A semiconductor memory device comprising:
a source layer;
a word line over the source layer, the word line including a first region, a second region, and a third region between the first region and the second region;
a first vertical channel penetrating the first region of the word line, the first vertical channel extending in a first direction;
a first connection pattern disposed between the source layer and the word line, the first connection pattern overlapping with the first region of the word line to be spaced apart from the word line in the first direction, the first connection pattern being in contact with a sidewall of the first vertical channel;
a first source channel in contact with the first connection pattern and the source layer, the first source channel extending in the first direction; and
a first source select line overlapping with the first region of the word line and spaced apart from the first connection pattern in the first direction, the first source select line surrounding the first source channel,
wherein the first source channel is disposed closer to the source layer than the first vertical channel and is connected to the first vertical channel via the first connection pattern.

14. The semiconductor memory device of claim 13, further comprising:
a second vertical channel penetrating the second region of the word line, the second vertical channel extending in the first direction;
a second connection pattern overlapping with the second region of the word line to be spaced apart from the word line in the first direction, the second connection pattern being in contact with a sidewall of the second vertical channel;
a second source channel in contact with the second connection pattern, the second source channel extending in the first direction; and
a second source select line overlapping with the second region of the word line to be spaced apart from the second connection pattern in the first direction, the second source select line surrounding the second source channel.

15. The semiconductor memory device of claim 14, further comprising a source slit insulating layer overlapping with the third region of the word line, the source slit insulating layer being disposed between the first connection pattern and the second connection pattern,
wherein the source slit insulating layer extends between the first source select line and the second source select line.

16. The semiconductor memory device of claim 14, further comprising:
gate insulating layers respectively disposed between the first source select line and the first source channel and between the second source select line and the second source channel; and
memory patterns respectively disposed between the first vertical channel and the word line and between the second vertical channel and the word line.

17. The semiconductor memory device of claim 14, wherein the source layer is spaced apart from the first source select line and the second source select line in the first direction and overlaps with the first source select line and the second source select line, and
wherein the first source channel and the second source channel extend into the source layer.

18. The semiconductor memory device of claim 14, further comprising:
a first drain select line overlapping with the first source select line with the word line interposed between the first drain select line and the first source select line, the first drain select line surrounding the first vertical channel; and
a second drain select line overlapping with the second source select line with the word line interposed between the second drain select line and the second source select line, the second drain select line surrounding the second vertical channel.

19. The semiconductor memory device of claim 18, further comprising a drain slit insulating layer overlapping with the third region of the word line, the drain slit insulating layer being disposed between the first drain select line and the second drain select line.

20. The semiconductor memory device of claim 18, further comprising:
a bit line overlapping with the first source select line and the second source select line with the first drain select line, the second drain select line, and the word line interposed between the bit line and the first and second source select lines; and
contact plugs extending toward the bit line from the first vertical channel and the second vertical channel.

21. The semiconductor memory device of claim 20, further comprising:
a peripheral circuit layer overlapping with the first drain select line and the second drain select line with the bit line interposed between the peripheral circuit layer and the first and second drain select lines, the peripheral circuit layer including a page buffer circuit;
a first interconnection structure connected to the bit line between the page buffer circuit and the bit line;
a second interconnection structure connected to the page buffer circuit between the page buffer circuit and the bit line;
a first bonding pad in contact with the first interconnection structure between the first interconnection structure and the second interconnection structure; and
a second bonding pad in contact with the second interconnection structure between the first interconnection structure and the second interconnection structure, the second bonding pad being bonded to the first bonding pad.

22. The semiconductor memory device of claim 13, wherein the first connection pattern includes:
a channel contact layer surrounding the sidewall of the first vertical channel; and
a first conductive layer disposed between the channel contact layer and the first source select line, the first conductive layer being in contact with the channel contact layer, and
wherein the first vertical channel extends into the first conductive layer.

23. The semiconductor memory device of claim 22, wherein the first connection pattern further includes a second conductive layer disposed between the channel contact layer and the word line, the second conductive layer being in contact with the channel contact layer.

24. The semiconductor memory device of claim 22, further comprising:
a first memory pattern disposed between the first vertical channel and the word line; and
a second memory pattern disposed between the first conductive layer and the first vertical channel, the second memory pattern being spaced apart from the first memory pattern by the channel contact layer.

25. The semiconductor memory device of claim 13, wherein a width of the first source channel is wider than a width of the first vertical channel.

* * * * *